(12) United States Patent
Chung et al.

(10) Patent No.: US 11,842,898 B2
(45) Date of Patent: Dec. 12, 2023

(54) METHOD FOR MANUFACTURING PANEL USING A GLASS SUBSTRATE AS THE LASER LIGHT TRANSMITTING MEMBER AND LASER PROCESSING APPARATUS

(71) Applicant: JSW AKTINA SYSTEM CO., LTD., Yokohama (JP)

(72) Inventors: Suk-Hwan Chung, Kanagawa (JP); Masashi Machida, Kanagawa (JP)

(73) Assignee: JSW AKTINA SYSTEM CO., LTD, Yokohama (JP)

( * ) Notice: Subject to any disclaimer, the term of this patent is extended or adjusted under 35 U.S.C. 154(b) by 16 days.

(21) Appl. No.: 17/259,166

(22) PCT Filed: Jun. 19, 2019

(86) PCT No.: PCT/JP2019/024360
§ 371 (c)(1),
(2) Date: Jan. 9, 2021

(87) PCT Pub. No.: WO2020/012903
PCT Pub. Date: Jan. 16, 2020

(65) Prior Publication Data
US 2021/0159079 A1  May 27, 2021

(30) Foreign Application Priority Data
Jul. 10, 2018 (JP) ................................. 2018-130422

(51) Int. Cl.
*H01L 21/268* (2006.01)
*B23K 26/08* (2014.01)
(Continued)

(52) U.S. Cl.
CPC ............ *H01L 21/268* (2013.01); *B23K 26/08* (2013.01); *H01L 21/02675* (2013.01); *H01L 21/20* (2013.01); *B23K 2101/40* (2018.08)

(58) Field of Classification Search
CPC ......................... H01L 21/02667–02675; H01L 21/2022–2026; H01L 29/04–045;
(Continued)

(56) References Cited

U.S. PATENT DOCUMENTS 6,174,370 B1 * 1/2001 Yoshida .............. H01L 21/6833
118/728
6,545,294 B1 4/2003 Yamaguchi et al.
(Continued)

FOREIGN PATENT DOCUMENTS

JP 2000-277429 A 10/2000
JP 2000-331932 A 11/2000
(Continued)

OTHER PUBLICATIONS

International Search Report from International Patent Application No. PCT/JP2019/024360, dated Sep. 24, 2019.
(Continued)

*Primary Examiner* — Sonya McCall-Shepard
(74) *Attorney, Agent, or Firm* — Potomac Law Group, PLLC

(57) ABSTRACT

Quality of a crystalline film is improved. In a method for manufacturing a panel, a polysilicon film is formed by emission of laser light to an amorphous silicon film 3A through a light-transmittable member 4 that can transmit the laser light.

30 Claims, 20 Drawing Sheets

(51) Int. Cl.
  *H01L 21/02* (2006.01)
  *H01L 21/20* (2006.01)
  *B23K 101/40* (2006.01)
  *B23K 26/03* (2006.01)
  *B23K 26/0622* (2014.01)
  *B23K 26/12* (2014.01)
  *B23K 26/352* (2014.01)
  *B23K 26/00* (2014.01)

(58) Field of Classification Search
  CPC ............ H01L 21/268; H01L 21/02686; H01L 21/02691; H01L 21/02678; H01L 2224/80039; H01L 2021/60292; H01L 2224/80224; H01L 2224/83224; H01L 21/02683; H01L 21/67115; H01L 2924/12042; H01L 21/26; H01L 21/76894; H01L 21/0275; H01L 21/423; H01L 21/02595; H01L 27/1277; H01L 21/02592; H01L 27/1274; H01L 27/1218; H01L 29/6675; H01L 29/78672; H01L 21/02609; H01L 29/78663; H01L 21/02516; H01L 27/1266; H01L 29/78603; H01L 21/6835; H01L 2221/68318; H01L 2221/68381; H01L 2221/68322; H01L 2224/03002; H01L 21/6734; H01L 2224/11002; H10K 71/00; C03C 27/06
  See application file for complete search history.

(56) References Cited

U.S. PATENT DOCUMENTS

| | | | |
|---|---|---|---|
| 6,558,988 | B1 | 5/2003 | Suzuki et al. |
| 6,888,162 | B2 | 5/2005 | Yamaguchi et al. |
| 7,714,251 | B2* | 5/2010 | Miyairi ............... B23K 26/073 438/795 |
| 2003/0216012 | A1* | 11/2003 | Sasaki ............... G02B 19/0014 257/E29.292 |
| 2004/0232432 | A1* | 11/2004 | Sato ...................... H01L 29/04 257/E21.134 |
| 2008/0214021 | A1* | 9/2008 | Tanaka ............. H01L 21/02529 438/798 |
| 2010/0035503 | A1* | 2/2010 | Kim ....................... H10K 71/00 445/25 |
| 2013/0216775 | A1* | 8/2013 | Sugiyama ............. C03C 17/006 428/138 |
| 2018/0033664 | A1 | 2/2018 | Fuji et al. |
| 2018/0210264 | A1* | 7/2018 | Tang ................. G02F 1/133305 |
| 2018/0366327 | A1* | 12/2018 | Mizumura ........ H01L 29/78675 |

FOREIGN PATENT DOCUMENTS

| | | |
|---|---|---|
| JP | 2001-102304 A | 4/2001 |
| JP | 2002-231629 A | 8/2002 |
| JP | 2006-032843 A | 2/2006 |
| JP | 2010-238897 A | 10/2010 |
| JP | 2011-204912 A | 10/2011 |
| JP | 2011-204913 A | 10/2011 |
| JP | 2012-054603 A | 3/2012 |
| JP | 2016-162856 A | 9/2016 |
| WO | WO 2015/174347 A1 | 11/2015 |

OTHER PUBLICATIONS

Office Action dated Jun. 28, 2022, in Japanese Patent Application No. 2018-130422.

* cited by examiner

METHOD FOR MANUFACTURING PANEL USING A GLASS SUBSTRATE AS THE LASER LIGHT TRANSMITTING MEMBER AND LASER PROCESSING APPARATUS

TECHNICAL FIELD

The present invention relates to a method for manufacturing a panel and a laser processing apparatus.

BACKGROUND ART

Japanese Patent Application Laid-Open Publication No. 2012-54603 (Patent Document 1) and Japanese Patent Application Laid-Open Publication No. 2016-162856 (Patent Document 2) describe a technique related to gas atmosphere existing between an emission unit that emits laser light and a processing target object.

Japanese Patent Application Laid-Open Publication No. 2011-204912 (Patent Document 3) describes a technique of inputting reflection light that is reflected on a processing target object into the processing target object again by using a reflection mirror.

Japanese Patent Application Laid-Open Publication No. 2011-204913 (Patent Document 4) describes a technique of controlling an output of laser light, that is input from an emission unit into a processing target object, on the basis of power of reflection light that is reflected on the processing target object.

RELATED ART DOCUMENTS

Patent Documents

Patent Document 1: Japanese Patent Application Laid-Open Publication No. 2012-54603
Patent Document 2: Japanese Patent Application Laid-Open Publication No. 2016-162856
Patent Document 3: Japanese Patent Application Laid-Open Publication No. 2011-204912
Patent Document 4: Japanese Patent Application Laid-Open Publication No. 2011-204913

SUMMARY OF THE INVENTION

Problems to be Solved by the Invention

In recent years, increase in a size of a substrate for use in a display apparatus such as a liquid crystal display or an organic EL display has been advanced. Accordingly, increase in a size of a laser annealing apparatus performing a laser annealing process for changing a non-crystalline film on the substrate into a crystalline film has been also advanced. In this case, it has been difficult to stabilize atmosphere existing between the emission unit that emits the laser light and the substrate because of the increase in the size of the substrate, and deterioration (unevenness) of the crystalline film based on the instability of the atmosphere has appeared as an issue. Therefore, in order to improve quality of the crystalline film formed on the substrate even when the increase in the size of the substrate has been advanced, it is desirable to stable the atmosphere.

Other objects and novel characteristics will be apparent from the description of the present application and the accompanying drawings.

Means for Solving the Problems

In a method for manufacturing a panel according to an embodiment, a polycrystalline semiconductor film is formed by emission of laser light to a non-crystalline semiconductor film through a member that can transmit the laser light.

Effects of the Invention

According to an embodiment, quality of a crystalline film can be improved.

BRIEF DESCRIPTIONS OF THE DRAWINGS

FIG. 1 is an appearance diagram showing a large-screen television exemplifying a liquid crystal display apparatus;
FIG. 2 is an appearance diagram showing a mobile communication device exemplifying a liquid crystal display apparatus;
FIG. 3 is a flowchart showing a flow of manufacturing steps for manufacturing a display apparatus of a first embodiment;
FIG. 4 is a diagram showing a configuration example of the display apparatus of the first embodiment;
FIG. 5 is a diagram showing a configuration example of a pixel shown in FIG. 4;
FIG. 6 is a cross-sectional view showing a device structure of a thin film transistor;
FIG. 7 is a flowchart showing a flow of steps for manufacturing the thin film transistor;
FIG. 8 is a flowchart for explaining a flow of steps for forming a channel film;
FIG. 9 is a diagram showing a schematic configuration of a laser processing apparatus of a related art;
FIG. 10 is a diagram showing a schematic configuration of a laser processing apparatus of the first embodiment;
FIG. 11 is a diagram showing a schematic configuration of a laser processing apparatus of a first modification example;
FIG. 12 is a flowchart for explaining a specific operation of the laser processing apparatus of the first modification example;
FIG. 13 is a diagram showing a schematic configuration of a laser processing apparatus of a second modification example;
FIG. 14 is a diagram showing a schematic appearance configuration of a carrying stage used in a laser processing apparatus of a third modification example;
FIG. 15 is a diagram schematically showing the laser processing apparatus using the carrying stage in the third modification example;
FIG. 16 is a diagram for explaining phenomena caused in change from an amorphous silicon film into a polysilicon film;
FIG. 17 is a diagram for explaining phenomena caused in change from an amorphous silicon film into a polysilicon film;
FIG. 18 is a diagram for explaining phenomena caused in change from an amorphous silicon film into a polysilicon film;
FIG. 19 is a diagram showing a schematic configuration of a laser processing apparatus of a second embodiment;
FIG. 20 is a plan view showing a configuration of a "substrate structural object" of the second embodiment;
FIG. 21 is a cross-sectional view taken out along a line A-A of FIG. 20;
FIG. 22 is a cross-sectional view showing a method for manufacturing the "substrate structural object";
FIG. 23 is a cross-sectional view showing a method for manufacturing the "substrate structural object", continued from FIG. 22;

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, a supplementary explanation thereof or others.

Also, in the embodiments described below, when referring to the number of elements (including the number of pieces, a value, an amount, a range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that the components (including element steps) are not always indispensable unless otherwise stated or except the case where the components are apparently indispensable in principle.

Similarly, in the embodiments described below, when referring to the shapes of the components or others, positional relation thereof, and the like, the substantially approximate or similar shapes or the like are included therein unless otherwise stated or except the case where it is conceivable that they are clearly excluded in principle. The same goes for the numerical value and the range described above.

Also, the same components are denoted by the same reference symbols throughout all the drawings for describing the embodiments, and the repetitive description thereof is omitted. Note that hatching is used even in a plan view so as to make the drawings easy to see in some cases.

First Embodiment

<One Example of Display Apparatus>

Figure 1:
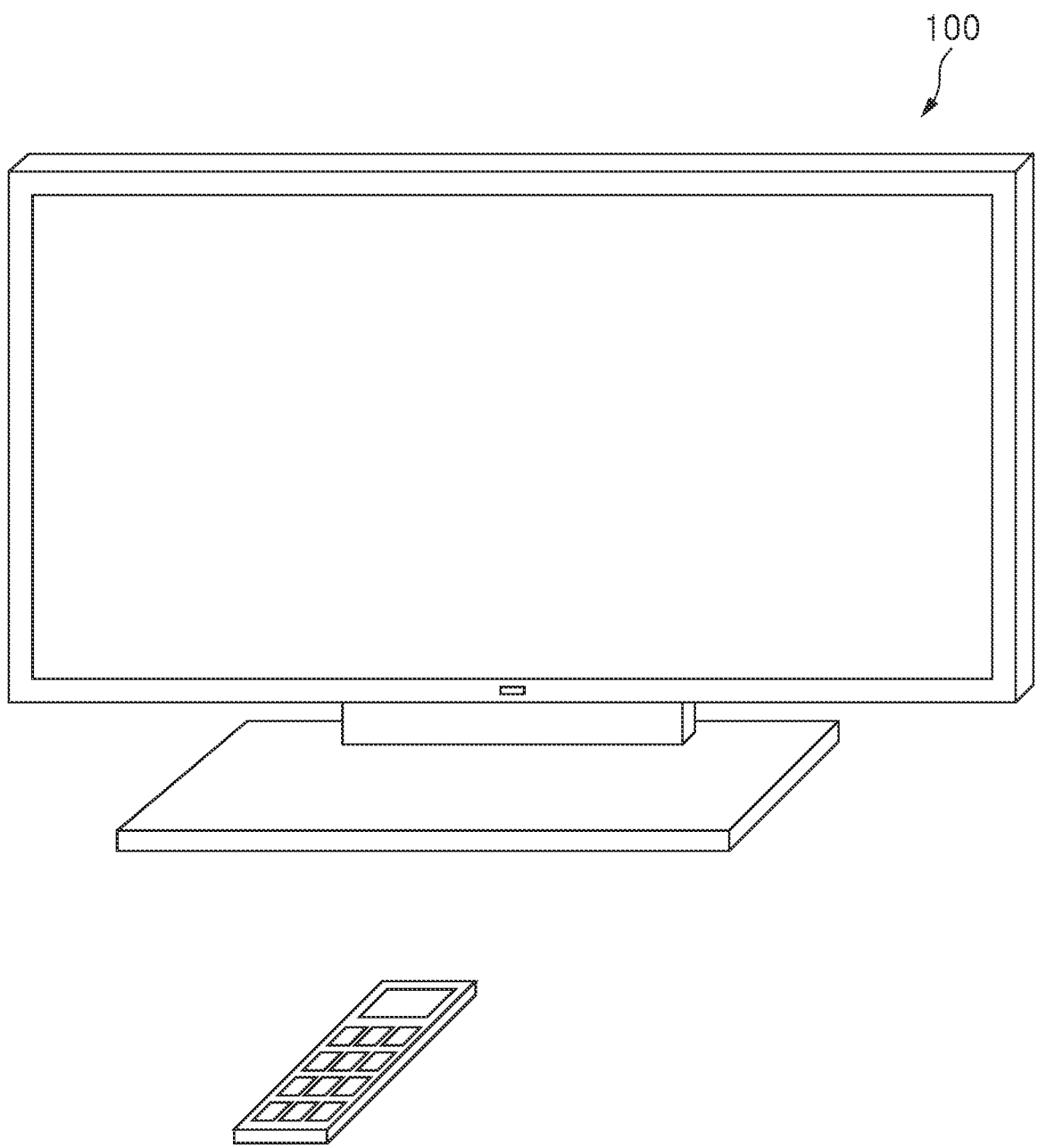
Figure 2:
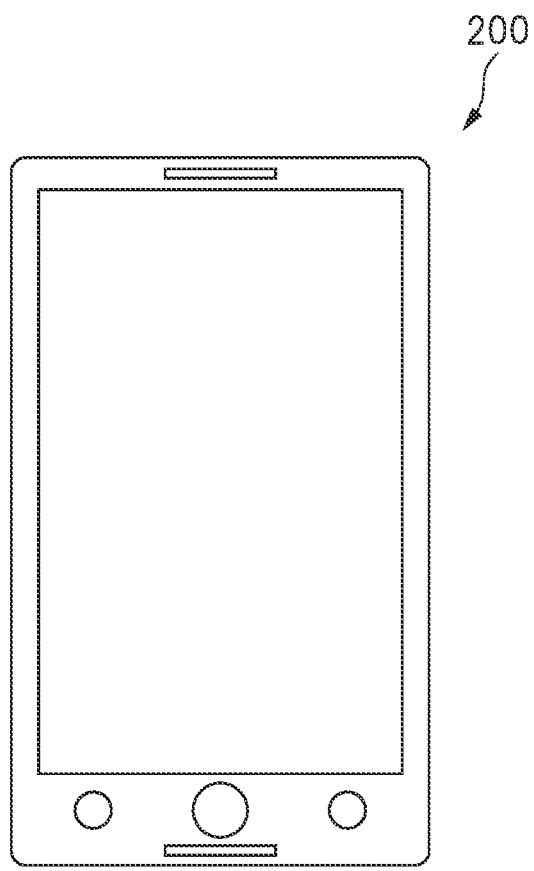

FIG. 1 is an appearance diagram showing a large-screen television exemplifying a liquid crystal display apparatus. In FIG. 1, The large-screen television 100 exemplifying the liquid crystal display apparatus is one example of a display apparatus of the present first embodiment. Meanwhile, FIG. 2 is an appearance diagram showing a mobile communication device exemplifying the liquid crystal display apparatus. In FIG. 2, a smartphone 200 is shown as one example of the mobile communication device, and this smartphone is also another example of the display apparatus of the present first embodiment.

As described above, display apparatuses having various sizes such as the large-screen television 100 having the large size and the smartphone 200 having the small size are targets of the display apparatus of the present first embodiment. Further, the display apparatus of the present first embodiment is not limited to the liquid crystal display apparatus, and, for example, an organic EL display apparatus is also its target.

<Step for Manufacturing Display Apparatus>

Next, summary of steps for manufacturing the display apparatus of the present first embodiment will be briefly explained by exemplifying steps for manufacturing the liquid crystal display apparatus.

Figure 3:
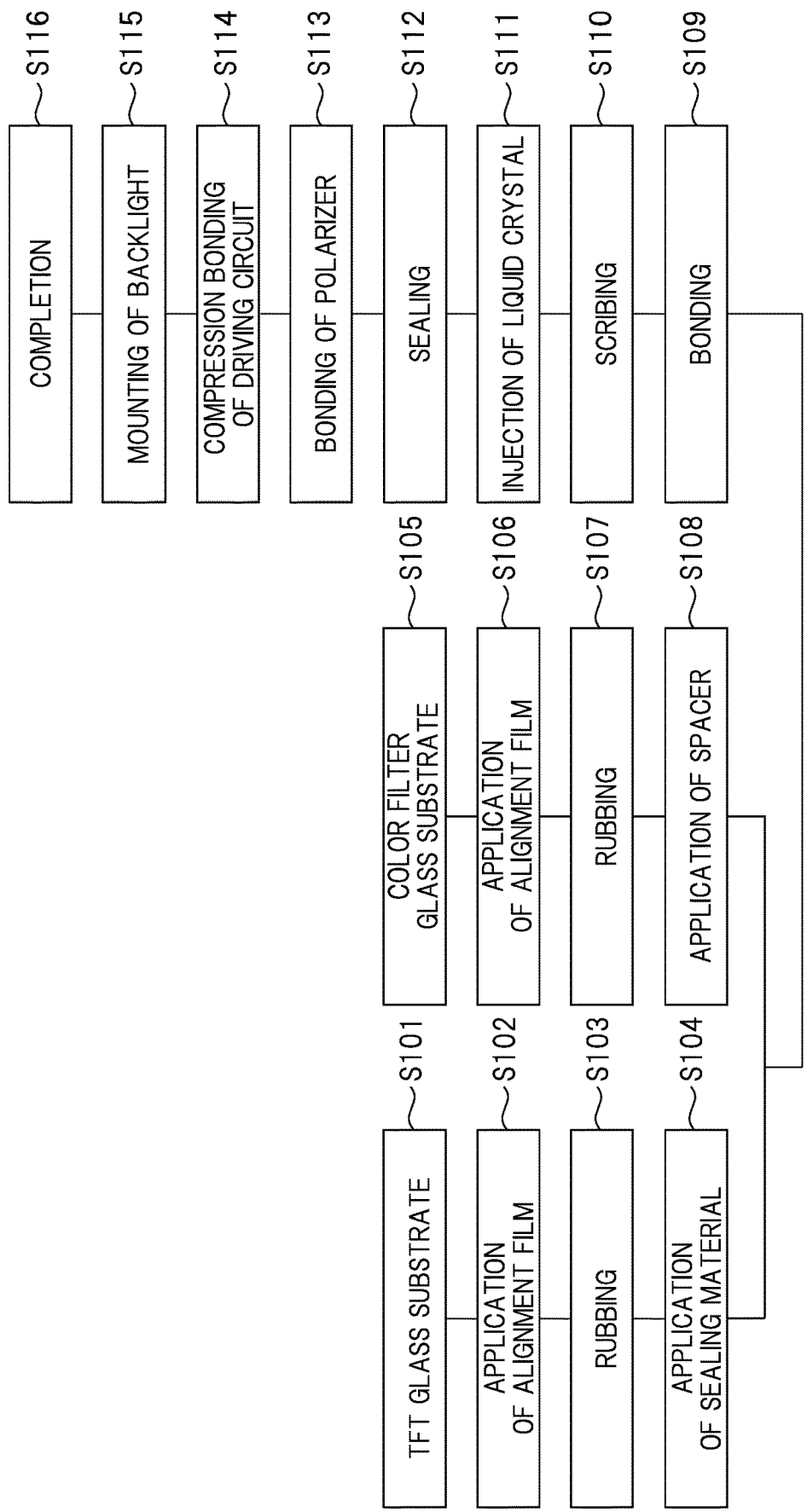

FIG. 3 is a flowchart showing a flow of the steps for manufacturing of manufacturing the display apparatus of the present first embodiment.

First, each of a TFT glass substrate and a color-filter glass substrate is formed. More specifically, a glass substrate is prepared, and a cleansing technique, a photolithography technique, an etching technique and an ashing technique are repeatedly used on this glass substrate, so that a thin film transistor is formed on the glass substrate. In this manner, the TFT glass substrate having the thin film transistor formed on a surface of the glass substrate can be obtained (S101).

Subsequently, onto a surface of the TFT glass substrate, for example, an alignment film made of a polyimide film is applied (S102).

Then, the surface of the TFT glass substrate having the alignment film formed thereon is rubbed (S103). In this manner, an alignment film having small scratches oriented in a predetermined direction can be formed on the surface of the TFT glass substrate. Then, onto the surface of the TFT glass substrate, a sealing member is applied (S104).

Meanwhile, another glass substrate is prepared, and a black matrix is formed on this glass substrate, and then, a pigment dispersing method, a coloring method, an electroplating method, a printing method or others is used on this glass substrate, so that a color filter is formed on the glass substrate. In this manner, the color-filter glass substrate having the color filter formed on a surface of the glass substrate can be obtained (S105).

Subsequently, onto the color-filter glass substrate, for example, an alignment film made of a polyimide film is applied (S106). Then, the surface of the color-filter glass substrate having the alignment film formed thereon is rubbed (S107). In this manner, an alignment film having small scratches oriented in a predetermined direction can be formed on the surface of the color-filter glass substrate. Then, onto the surface of the color-filter glass substrate, a spacer is applied (S108).

Next, the TFT glass substrate on which the sealing member is applied and the color-filter glass substrate on which the spacer is applied are bonded to each other (S109), and then, the bonded TFT glass substrate and color-filter glass substrate are subjected to a scribing process (S110). In this manner, the bonded TFT glass substrate and color-filter glass substrate are cut to have a size for each liquid crystal display apparatus.

Then, liquid crystal is injected into a gap secured by the sealing member and the spacer between the TFT glass substrate and the color-filter glass substrate (S111). And, the gap (space) into which the liquid crystal has been injected is sealed (S112).

Subsequently, a pair of polarizers are bonded so as to sandwich the bonded TFT glass substrate and color-filter glass substrate (S113). In this manner, a liquid crystal display panel can be manufactured. Then, a driving circuit for use in driving the liquid crystal display panel is compressively bonded to the manufactured liquid crystal display panel (S114), and besides, a backlight is mounted on the liquid crystal display panel (S115). In this manner, the liquid crystal display apparatus is completed (S116). In the manner as described above, the display apparatus of the present first embodiment can be manufactured.

<Detailed Configuration of Display Apparatus>

Subsequently, a detailed configuration of the display apparatus of the present first embodiment will be explained.

Figure 4:
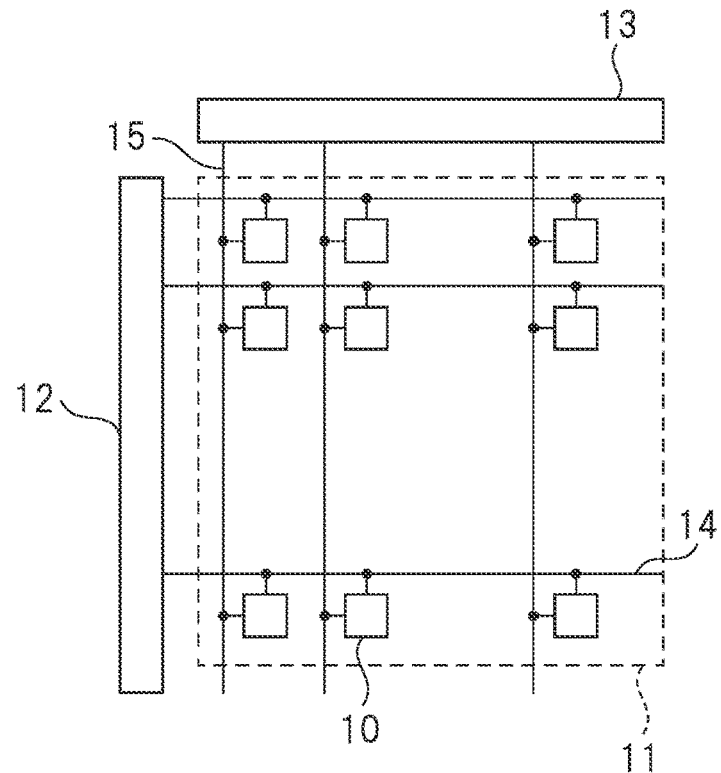

FIG. 4 is a diagram showing a configuration example of the display apparatus of the present first embodiment. As shown in FIG. 4, the display apparatus of the present first embodiment includes a pixel unit 11 where a plurality of pixels 10 are arranged in a matrix (line-column) form. The display apparatus of the present first embodiment includes a scan-line driving circuit 12 and a signal-line driving circuit 13 as circuits that drive the plurality of pixels 10 configuring the pixel unit 11. Either a selection state or a non-selection state of the pixel 10 is determined for each row by a scan signal that is supplied through a wiring 14 (scan line) electrically connected to the scan-line driving circuit 12. To the pixel 10 that has been selected by the scan signal, an image signal (video signal) is supplied through a wiring 15 (signal line) electrically connected to the signal-line driving circuit 13.

In this case, FIG. 4 shows a stripe arrangement example in which the plurality of pixels are arranged in a matrix form. However, the present invention is not limited to this arrangement. For example, delta arrangement or Bayer arrangement is also applicable to the plurality of pixels 10.

Further, as a display mode of the pixel unit 11, a progressive mode, an interlace mode or others can be used. Color components that are controlled on the pixels 10 in the color display are not limited to three colors of RGB (red, green and blue), and, for example, a configuration of RGBW (red, green, blue and white) or a configuration of RGB added with one or more colors such as yellow, cyan, magenta or others are also applicable. In this case, a size (dimension) of the display region may be different for each dot of the color component. Note that the display apparatus of the present first embodiment is not limited to the display apparatus for the color display and is also applicable to a display apparatus for monochrome display.

Figure 5:
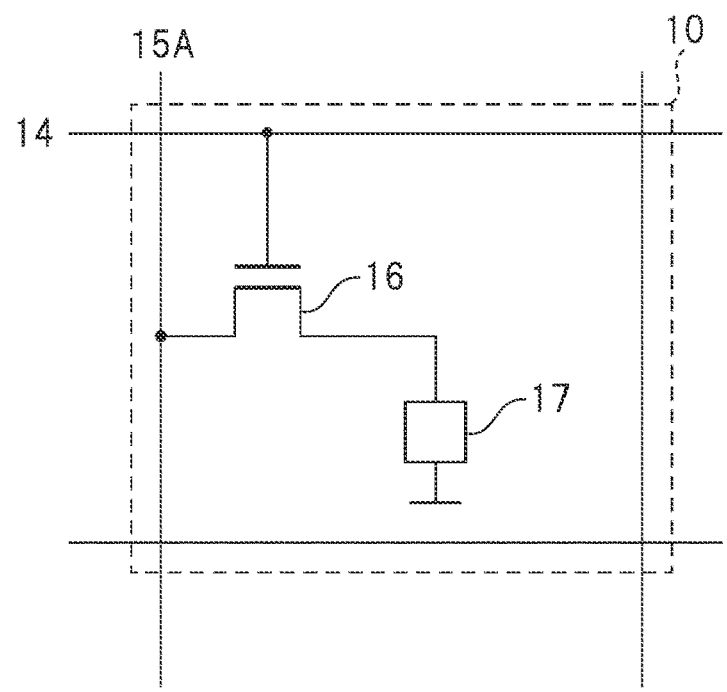

Next, FIG. 5 is a diagram showing a configuration example of the pixels shown in FIG. 4. As shown in FIG. 5, the pixel 10 includes a thin film transistor 16 functioning as a switching element and a liquid crystal element 17 functioning as a display unit. For example, the liquid crystal element 17 is configured so that a liquid crystal material is sandwiched between a pair of electrodes (a pixel electrode and an opposite electrode).

In the thin film transistor 16, the gate electrode is electrically connected to the wiring 14 (scan line). Meanwhile, either one of the source electrode and the drain electrode is electrically connected to a wiring 15A (signal line), and the other is electrically connected to the pixel electrode of the liquid crystal element 17.

The panel configuring the display apparatus as described above includes a plurality of pixel regions (the plurality of pixels), and the thin film transistor is formed in each of the plurality of pixel regions.

<Device Structure of Thin Film Transistor>

Subsequently, a device structure of the thin film transistor 16 will be explained.

Figure 6:
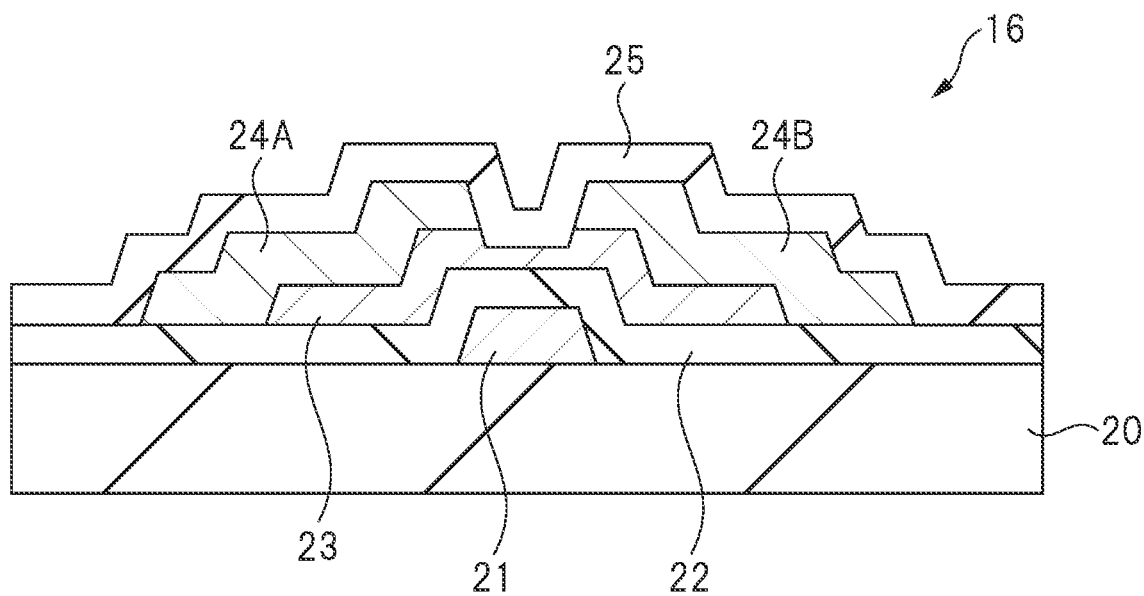

FIG. 6 is a cross-sectional view showing the device structure of the thin film transistor. The thin film transistor 16 shown in FIG. 6 has a bottom-gate structure. As shown in FIG. 6, the thin film transistor 16 includes a gate electrode 21 that is formed on the substrate 20 having the insulating surface. And, a gate insulating film 22 made of, for example, a silicon oxide film is formed on the substrate 20 so as to cover this gate electrode 21. Further, a channel film 23 made of a polysilicon film that is a polycrystalline semiconductor film is formed on this gate insulating film 22, and a source electrode 24A and a drain electrode 24B are formed so as to be in contact with this channel film 23. As shown in FIG. 6, a protective film 25 is formed so as to cover the channel film 23, the source electrode 24A and the drain electrode 24B. As described above, the thin film transistor 16 is formed.

<Steps for Manufacturing Thin Film Transistor>

Next, the steps for manufacturing the thin film transistor will be explained.

Figure 7:
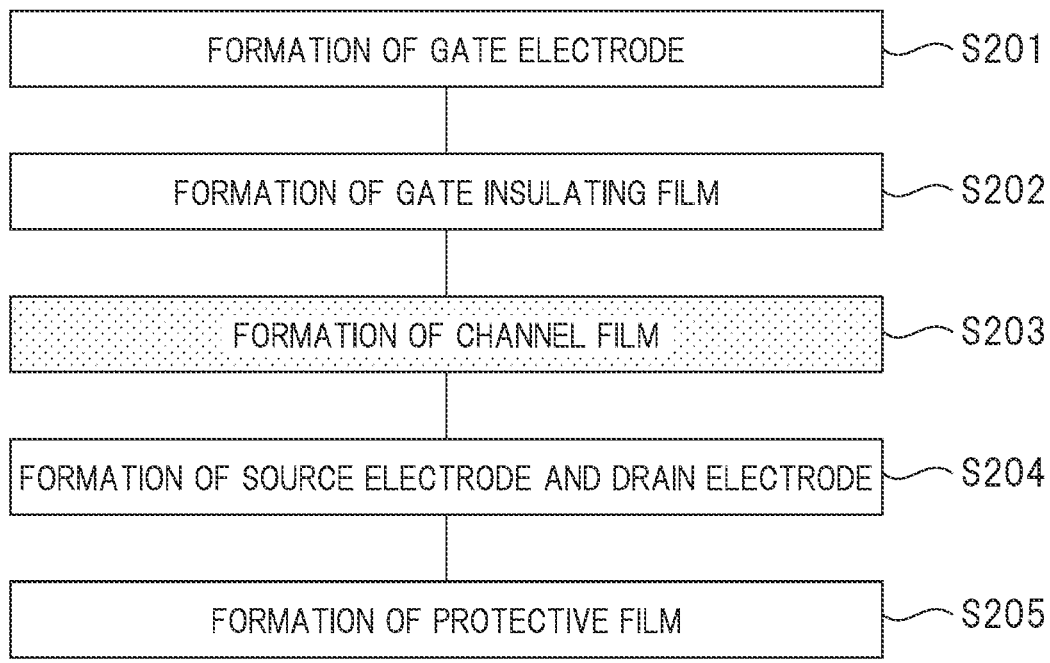

FIG. 7 is a flowchart showing a flow of the steps for manufacturing the thin film transistor.

First, the gate electrode is formed on the substrate made of, for example, glass or quartz (S201). As a material of the gate electrode, for example, a metal material such as molybdenum, titanium, chromium, tantalum, tungsten, aluminum, copper, neodymium and scandium or an alloy material mainly containing such a metal material can be used.

Next, the gate insulating film is formed on the gate electrode (S202). The gate insulating film is made of, for example, a silicon oxide film, and can be formed by using a CVD (Chemical Vapor Deposition) method.

And, the channel film is formed on the gate insulating film (S203). This channel film can be made of, for example, a polysilicon film.

Subsequently, the source electrode and the drain electrode are formed on the channel film (S204). As each material of the source electrode and the drain electrode, for example, aluminum, chromium, tantalum, titanium, molybdenum, tungsten or others can be used.

Then, the protective film is formed so as to cover the channel film, the source electrode and the drain electrode (S205). This protective film can be made of, for example, a silicon oxide film.

In the manner as described above, the thin film transistor can be manufactured.

<<Steps for Forming Channel Film>>

Steps for forming the channel film will be explained in detail here.

Figure 8:
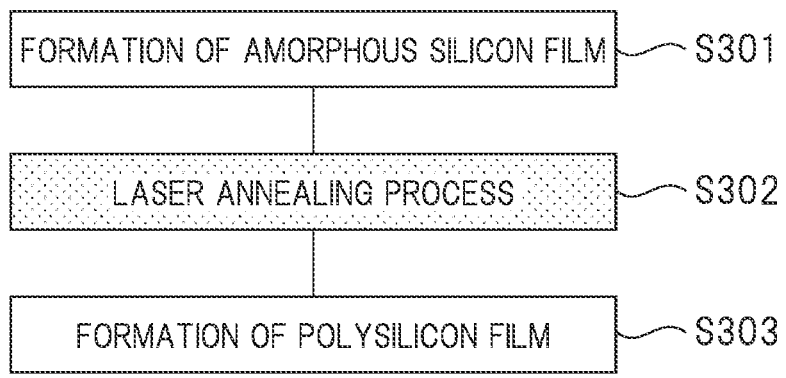

FIG. 8 is a flowchart for explaining a flow of the steps for forming the channel film.

As shown in FIG. 8, in the steps for forming the channel film, an amorphous silicon film is formed on the gate insulating film first (S301). Then, a laser annealing process is performed so that laser light is emitted to the amorphous silicon film (S302). In the manner, the amorphous silicon film is heated. As a result, the polysilicon film is made from the amorphous silicon film (S303). In the manner as described above, the channel film made of the polysilicon film can be formed, and availability of the channel film made of not the amorphous silicon film but the polysilicon film will be explained below.

Since the channel film has a function of a passage for electrons, characteristics of the channel film affect a performance of the thin film transistor. In this case, when the channel film is formed from the amorphous silicon film, unevenness of the channel film is caused since uneven crystal grains are formed in the amorphous silicon film due to temporal change. As a result, temporal deterioration of the thin film transistor as exemplified by deterioration in mobility appears. In other words, when the channel film is formed from the amorphous silicon film, it is difficult to maintain the characteristics of the thin film transistor in a long period of time because of the temporal deterioration of the amorphous silicon film.

On the other hand, when the channel film is formed from the polysilicon film, ordered crystal arrangement is formed in the polysilicon film, and therefore, the polysilicon film is more difficult to be temporally deteriorated than the amorphous silicon film. In other words, in order to maintain the characteristics of the thin film transistor in a long period of time, it is desirable to use, as the channel film, the polysilicon film that is more difficult to be temporally deteriorated than the amorphous silicon film.

In the manner as described above, in the present first embodiment, the channel film is formed from the polysilicon film. More specifically, when the laser annealing process is performed to the amorphous silicon film after the amorphous silicon film is formed as described above, the amorphous silicon film is changed into the polysilicon film. Therefore, in order to form the channel film from the polysilicon film, the laser annealing process (heating process) is necessary. And, in order to perform this laser annealing process, a laser processing apparatus is necessary.

A technical concept of the present first embodiment is a devisal for the laser processing apparatus. A laser processing apparatus of a related art will be explained below first, and then, room for improvement in the related art will be explained. Then, the technical concept of the present first embodiment that is subjected to the devisal for the room for the improvement in the related art will be explained.

<Laser Processing Apparatus in Related Art>

Figure 9:
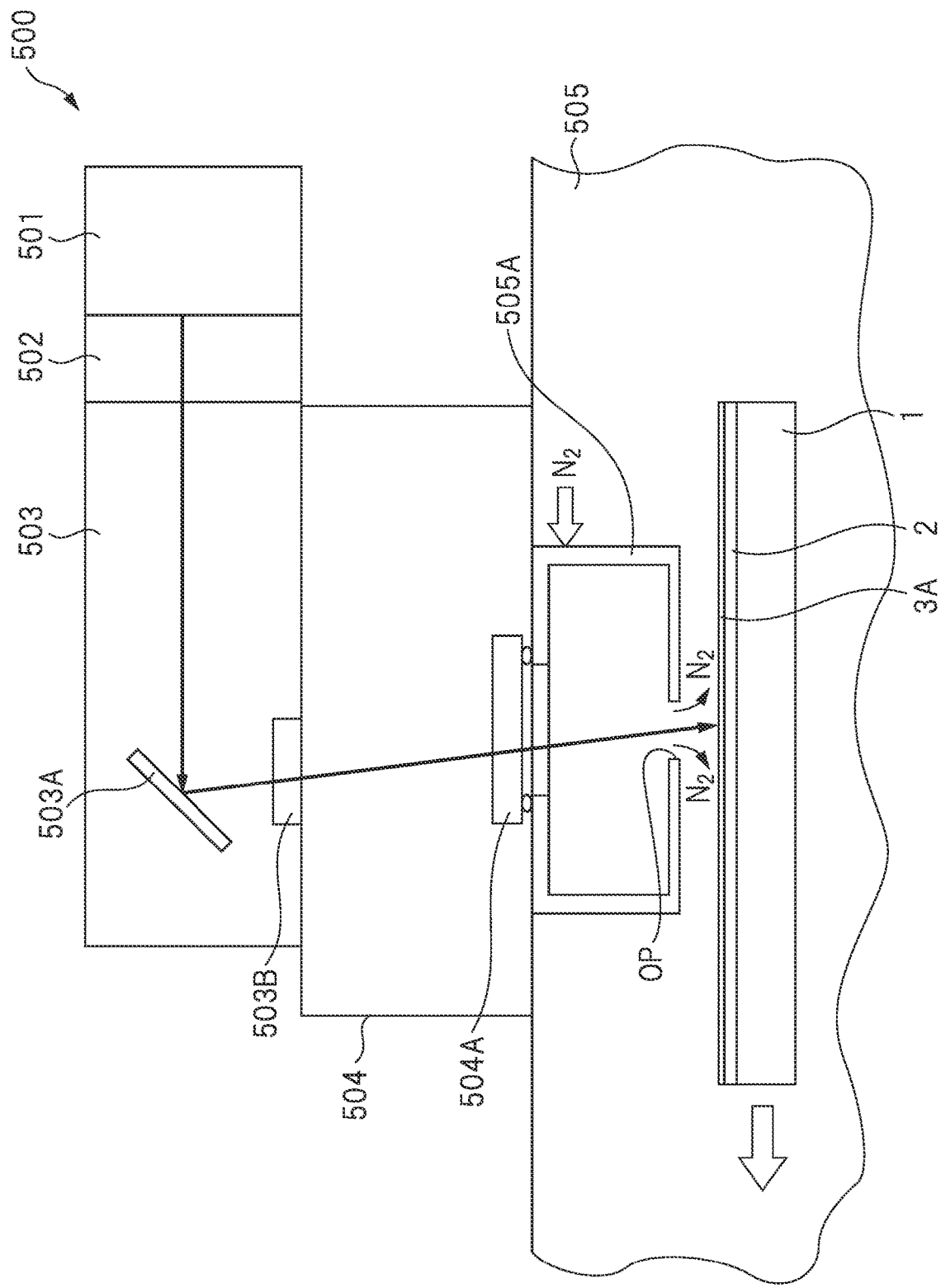

FIG. 9 is a diagram showing a schematic configuration of the laser processing apparatus of the related art.

The "related art" described in the present application is not a publicly known conventional technique but a technique having an issue that has been newly found by the inventors, and is a technique that is purposely described as a premise technique (non-publicly known technique) of a new technical concept.

In FIG. 9, a laser processing apparatus 500 of the related art includes a laser-light generator 501, a light attenuator 502, an optical system module 503, a closed enclosure 504 and a processing chamber 505. The laser-light generator 501 is made of a laser oscillator that outputs the laser light, and a light attenuator 502 for use in adjusting the output of the laser light is arranged at a position in a direction of the output of the laser-light generator 501. The light attenuator 502 has a function that adjusts the output of the laser light by adjusting a light transmittance of the laser light.

Next, the optical system module is arranged at a position in a direction of travelling of the laser light, output of which is adjusted by the light attenuator 502. This optical system module is made of a reflection mirror 503A, a lens (not illustrated) and others, and has a function that shapes the laser light that is input from the light attenuator 502 to the optical system module 503 to be linear-beam shaped laser light. And, a sealing window 503B having a light transmittance of the laser light is arranged at an outlet position of the optical system module 503, and the laser light that has been shaped by the optical system module 503 is output from the optical system module 503 through this sealing window 503B.

Subsequently, the closed enclosure 504 is arranged at a position in a direction of the travelling of the laser light that is output from the optical system module 503. A closed space is formed inside this closed enclosure 504, and the laser light travels in this closed space. A sealing window 504A having a light transmittance of the laser light is arranged at an outlet position of the closed enclosure 504.

A processing chamber 505 is arranged at a position in a direction of the travelling of the laser light that is output from the closed enclosure 504. A sealing box 505A is attached to this processing chamber 505, the sealing box 505A being connected to the sealing window 504A that is arranged at the outlet position of the closed enclosure 504. To this sealing box 505A, for example, inert gas as exemplified by nitrogen gas is supplied. In this case, as shown in FIG. 9, while an upper side of the sealing box 505A is sealed by the sealing window 504A arranged in the closed enclosure 504, a lower side of the sealing box 505A has an opening OP. Therefore, the nitrogen gas that is supplied into the sealing box 505A is exhausted from the lower side of the sealing box 505A through the opening OP. In this case, as shown in FIG. 9, a carrying stage 1 is arranged below the opening OP that is arranged in the sealing box 505A, and a substrate 2 made of, for example, glass or quartz is arranged on this carrying stage 1. An amorphous silicon film 3A is formed on a surface (upper surface) of this substrate 2, and the nitrogen gas that is exhausted from the opening OP arranged in the sealing box 505A is blown out to the amorphous silicon film 3A that is formed on the surface of the substrate 2. Note that the carrying stage 1 on which the substrate 2 is placed is configured to be movable in, for example, an arrow direction of FIG. 9, and can carry the substrate 2 on the carrying stage 1 in the arrow direction.

<Operation of Laser Processing Apparatus of Related Art>

The laser processing apparatus 500 of the related art is configured as described above. Hereinafter, an operation of the laser processing apparatus 500 of the related art will be explained with reference to FIG. 9.

In FIG. 9, the optical output of the laser light that is output from the laser-light generator 501 is adjusted by the light attenuator 502, and then, the laser light is input to the optical system module 503. The laser light that is input to the optical system module 503 is shaped into the linear-beam light by a lens system arranged inside the optical system module 503. The linear-beam shaped laser light is reflected by, for example, the reflection mirror 503A arranged inside the optical system module 503, and then, is input to the closed enclosure 504 through the sealing window 503B. The laser light that has been input to the closed enclosure 504 travels in the internal space of the closed enclosure 504, and then, is input to the sealing box 505A arranged in the processing chamber 505 through the sealing window 504A. Then, the laser light that has been input to the sealing box 505A is emitted to the substrate 2 on the carrying stage 1 through the opening OP arranged in the sealing box 505A. More specifically, the laser light is emitted to the amorphous silicon film 3A formed on the surface of the substrate 2. At this time, the nitrogen gas is supplied to the sealing box 505A, and the nitrogen gas is exhausted from the opening OP arranged on the lower side of the sealing box 505A. Then, the nitrogen gas that has been exhausted from the opening OP arranged on the sealing box 505A is blown out to the substrate 2 on the carrying stage 1. More specifically, the nitrogen gas is blown out to the amorphous silicon film 3A formed on the surface of the substrate 2. In this manner, in the laser processing apparatus 500 of the related art, the linear-beam shaped laser light is emitted to the amorphous silicon film 3A formed on the surface of the substrate 2 while the nitrogen gas is blown out thereto. More specifically, during the movement of the carrying stage 1 in the arrow direction, the linear-beam shaped laser light is emitted to the amorphous silicon film 3A formed on the surface of the substrate 2 while the nitrogen gas is blown out thereto. As a result, the amorphous silicon film 3A formed on the surface of the substrate 2 is locally heated, and thus, a region to which the laser light is emitted in the amorphous silicon film 3A can be scanned while the region to which the laser light is emitted in the amorphous silicon film 3A is changed into the polysilicon film. In the manner, according to the related art, the entire amorphous silicon film 3A can be changed in to the polysilicon film.

<Study on Improvement>

The laser processing apparatus is used in order to improve the characteristics of the thin film transistor (selection transistor, switching transistor) for use in a high-performance display apparatus as exemplified by a liquid crystal display apparatus and an organic EL display apparatus. More specifically, the laser processing apparatus is used in order to form the channel film of the thin film transistor from not the amorphous silicon film that is easy to be temporally deteriorated but the polysilicon film that is difficult to be temporally deteriorated. In other words, the laser processing apparatus is used in order to perform the laser annealing process to the amorphous silicon film to change the amorphous silicon film into the polysilicon film.

In this case, the laser annealing process using the laser processing apparatus is performed in a state of a mother glass. Meanwhile, in recent years, the number of pieces of the panels obtained from single mother glass has been increased in order to reduce a manufacturing cost. As a result, increase in a size of the mother glass that is used in the steps for manufacturing the display apparatus has been advanced. This means that it is also necessary to increase a size of the laser processing apparatus that performs the laser annealing process in the state of the mother glass.

Regarding this point, in the related art, the laser annealing process is performed while the entire processing chamber of the laser processing apparatus is vacuumed. However, the laser processing apparatus of the "vacuum type" causing the vacuumed entire processing chamber results in increase in a weight of the laser processing apparatus and decrease in productivity (increase in time taken for vacuuming the processing chamber) because of the increase in the size of the laser processing apparatus due to the increase in the size of the mother glass, and therefore, it is said that it is necessary to study an alternative apparatus.

Accordingly, for example, as described in the laser processing apparatus of the related art (see FIG. 9), the laser processing apparatus has been studied, the laser processing apparatus locally emitting the laser light to the amorphous silicon film 3A while the nitrogen gas that is supplied to the sealing box 505A arranged in the apparatus is locally blown out to the amorphous silicon film 3A formed on the surface of the substrate 2. According to such a laser processing apparatus, atmosphere on the region of the amorphous silicon film 3A to which the nitrogen gas has been blown out locally becomes atmosphere having a low oxygen concentration (nearly vacuumed atmosphere). In other words, according to the laser processing apparatus of the related art, since the sealing box 505A is used, atmosphere only on an upper side of the region to which the laser light is emitted can become the atmosphere having the low oxygen concentration (nearly vacuumed atmosphere), and therefore, the reduction in the weight of the laser processing apparatus and the improvement of the productivity can be achieved more than those of the laser processing apparatus of the "vacuum type".

However, by the study of the present inventors, it has been found that the laser processing apparatus of the related art also has the room for the improvement because of the further increase in the size of the mother glass. In other words, the increase in the size of the mother glass increases time for scanning the entire surface of the mother glass with the laser light. As a countermeasure for this, it is thought to reduce the scanning time by increasing a length of the linear-beam shape. However, in this case, by the increase in the length of the linear-beam shape, a size of the optical system module 503 for use in shaping the laser light into the linear-beam shaped laser light is also increased. Besides, sizes of the sealing box 505A and the sealing window 504A for use in stabilizing the local atmosphere are also increased. And, the increase in the size of the sealing box 505A makes it difficult to maintain the stability of the local atmosphere that is formed by the blowing of the nitrogen gas from the sealing box 505A. As a result, by the study of the present inventors, it has been found that the reduction in the evenness of the polysilicon film appears because of the instability of the local atmosphere. As described above, in the laser processing apparatus of the related art, the further increase in the size of the mother glass makes it difficult to improve the characteristics of the thin film transistor because of the reduction in the evenness of the polysilicon film that is used as the channel film of the thin film transistor.

Accordingly, in the present first embodiment, a devisal is made for the room for the improvement of the reduction in the characteristics of the thin film transistor, that appears in the laser processing apparatus of the related art because of the increase in the size of the mother glass. A technical idea of the present first embodiment making this devisal will be explained below with reference to the drawings.

<Configuration of Lase Processing Apparatus of First Embodiment>

Figure 10:
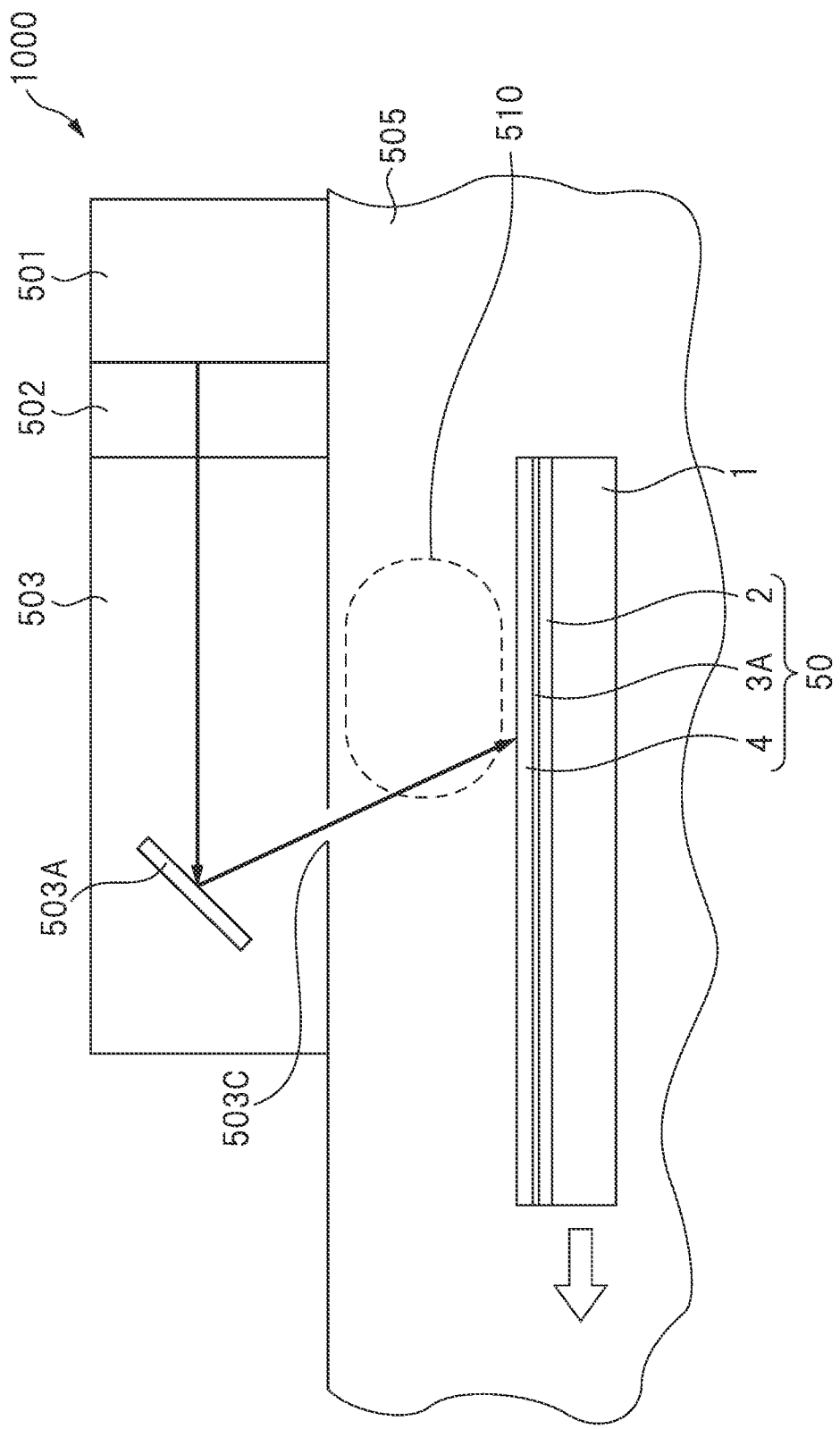

FIG. 10 is a diagram showing a schematic configuration of the laser processing apparatus of the present first embodiment.

In FIG. 10, a laser processing apparatus 1000 of the present first embodiment includes a laser-light generator 501, a light attenuator 502, an optical system module 503 and a processing chamber 505.

The laser-light generator 501 is made of a laser oscillator that outputs the laser light, and a light attenuator 502 for use in adjusting the output of the laser light is arranged at a position in a direction of the output of the laser-light generator 501. The light attenuator 502 has a function that adjusts the output of the laser light by adjusting a light transmittance of the laser light.

Next, the optical system module is arranged at a position in a direction of travelling of the laser light, output of which is adjusted by the light attenuator 502. This optical system module is made of a reflection mirror 503A, a lens (not illustrated) and others, and has a function that shapes the laser light that is input from the light attenuator 502 to the optical system module 503 to be linear-beam shaped laser light. And, an opening 503C is arranged at an outlet position of the optical system module 503, and the laser light that has been shaped by the optical system module 503 is output from the optical system module 503 through this opening 503C.

Subsequently, the processing chamber 505 is arranged at a position in a direction of the travelling of the laser light that is output from the optical system module 503. In this case, as shown in FIG. 9, a carrying stage 1 is arranged in the processing chamber 505, and a substrate 2 made of, for example, glass or quartz is arranged on this carrying stage 1.

A non-crystalline semiconductor film is formed on a surface (upper surface) of this substrate 2. More specifically, an amorphous silicon film 3A is formed on the surface of this substrate 2. On this amorphous silicon film 3A, a light-transmittable member 4 is arranged. This light-transmittable member 4 has a light transmittance of the laser light, and is made of, for example, a material containing glass or quartz as a main component. Particularly, the light-transmittable member 4 can be made of the mother glass having the same size as that of the substrate 2. This light-transmittable member 4 is arranged so as to cover the entire upper surface of the substrate 2. And, the light-transmittable member 4 and the substrate 2 are fixed to each other by, for example, static electricity.

In the present specification, the substrate 2, the amorphous silicon film 3A formed on the substrate 2 and the light-transmittable member 4 are collectively called a "substrate structural object 50".

The carrying stage 1 on which the "substrate structural object 50" is placed is configured to be movable in, for example, an arrow direction of FIG. 9, and can carry the substrate structural object 50 on the carrying stage 1 in the arrow direction.

<Operation of Laser Processing Apparatus of First Embodiment>

The laser processing apparatus 1000 of the present first embodiment is configured as described above. Hereinafter, an operation of the laser processing apparatus 1000 of the present first embodiment will be explained with reference to FIG. 10.

First, a light-transmittable member 4 that can transmit the laser light is arranged on the substrate 2 having the amorphous silicon film 3A that is the non-crystalline semiconductor film formed on its upper surface. Then, the laser light is generated by the laser-light generator 501.

Next, in FIG. 10, an optical output of the laser light that has been output from the laser-light generator 501 is adjusted by the light attenuator 502, and then, the laser light is input into the optical system module 503. In the optical system module 503, the laser light that has been input into the optical system module 503 is shaped into the linear-beam shaped laser light by a lens system that is arranged inside the optical system module 503. The linear-beam shaped laser light is reflected by, for example, the reflection mirror 503A that is arranged inside the optical system module 503, and then, is input to the processing chamber 505 though the opening 503C. The laser light that has been input to the processing chamber 505 travels in the internal space of the processing chamber 505, and then, is emitted to the "substrate structural object 50" that is arranged on the carrying stage 1. More specifically, the laser light is emitted to the amorphous silicon film 3A, that is formed on the surface of the substrate 2, through the light-transmittable member 4 configuring a part of the "substrate structural object 50". In this manner, in the laser processing apparatus 1000 of the present first embodiment, the linear-beam shaped laser light is emitted to the amorphous silicon film 3A, that is formed on the surface of the substrate 2, through the light-transmittable member 4. More specifically, while the carrying stage 1 is moved in the arrow direction, the linear-beam shaped laser light is emitted to the amorphous silicon film 3A, that is formed on the surface of the substrate 2, through the light-transmittable member 4. As a result, the amorphous silicon film 3A that is formed on the surface of the substrate 2 is locally heated, so that the region to which the laser light is emitted in the amorphous silicon film 3A can be scanned while the region to which the laser light is emitted in the amorphous silicon film 3A is changed into the polysilicon film. As descried above, according to the laser processing apparatus 1000 of the present first embodiment, the entire amorphous silicon film 3A is changed into the polysilicon film.

Feature of First Embodiment

Subsequently, a feature of the present first embodiment will be explained.

The feature of the present first embodiment is that, for example, as shown in FIG. 10, the laser light is emitted to the amorphous silicon film 3A while the light-transmittable member 4 having the light transmittance of the laser light is arranged on the substrate 2 having the amorphous silicon film 3A that is the non-crystalline semiconductor film formed on its upper surface. In this manner, an upper surface of the amorphous silicon film 3A is covered with the light-transmittable member 4 and is adhered onto the light-transmittable member 4, and therefore, is not affected by instability (fluctuation) of the atmosphere over the amorphous silicon film 3A. As a result, according to the feature of the present first embodiment, when the amorphous silicon film 3A is changed into the polysilicon film by being subjected to the emission of the laser light, the reduction in the evenness (the variation in crystal grains) of the polysilicon film due to the instability of the atmosphere can be suppressed. In other words, according to the feature of the present first embodiment, the characteristics of the thin film transistor can be improved as a result of the suppression in the reduction in the evenness of the polysilicon film that is used as the channel film of the thin film transistor.

As described above, the feature of the present first embodiment is that the light-transmittable member 4 is arranged on the amorphous silicon film 3A. In other words, in the present first embodiment, even if the atmosphere over the amorphous silicon film 3A becomes instable, the contact between the instable atmosphere and the amorphous silicon film 3A is blocked by the light-transmittable member 4 when the light-transmittable member 4 is arranged on the amorphous silicon film 3A. In this manner, according to the present first embodiment, when the amorphous silicon film 3A is changed into the polysilicon film, the evenness of the polysilicon film can be improved without being affected by the atmosphere.

A basic concept of the present first embodiment is not a concept for controlling the atmosphere so as to suppress the instability of the atmosphere over the amorphous silicon film 3A but a concept in making an approach from a different point of view for arranging the member on the amorphous silicon film 3A for blocking the direct contact between the instable atmosphere and the amorphous silicon film 3A. According to such a basic concept of the present first embodiment, it can be said that the concept is very excellent in that the reduction in the evenness (the variation in crystal grains) of the polysilicon film due to the instable atmosphere can be suppressed while the difficulty in the control of the atmosphere is avoided. And, in the present first embodiment, even when the member is arranged on the amorphous silicon film 3A in order to suppress the direct contact between the instable atmosphere and the amorphous silicon film 3A, it is necessary to emit the laser light to the amorphous silicon film 3A. Therefore, the member is made of the light-transmittable member 4 having the light transmittance of the laser light. In other words, a technical significance of the arrangement of the light-transmittable member 4 on the amorphous silicon film 3A in the present first embodiment lies in that the direct contact between the instable atmosphere and the amorphous silicon film 3A is blocked while the emission of the laser light to the amorphous silicon film 3A is secured. As described above, according to the feature of the present first embodiment, the polysilicon film having the high evenness can be formed from the amorphous silicon film 3A without being affected by the instability of the atmosphere, and therefore, the characteristics of the thin film transistor having the polysilicon film as the channel film can be improved, so that the performance of the display apparatus can be improved.

For example, in the laser processing apparatus 500 of the related art shown in FIG. 9, the sealing box 505A is arranged above the substrate 2 having the amorphous silicon film 3A formed on its upper surface, and the nitrogen gas that is supplied to this sealing box 505A is blown out from the sealing box 505A to the substrate 2. In this manner, in the laser processing apparatus 500 of the related art, while the local atmosphere having the low oxide concentration caused by the blowing of the nitrogen gas is formed over the substrate 2, the laser light is emitted to a portion exposed to this local atmosphere in the amorphous silicon film 3A, and therefore, the amorphous silicon film 3A is changed into the polysilicon film having the evenness.

However, in the laser processing apparatus 500 having such a structure of the related art, although it is necessary to increase the size of the sealing box 505A because of the increase in the size of the substrate 2, the increase in the size of the sealing box 505A makes it difficult to stable the local atmosphere (cause the even local atmosphere) caused by the nitrogen gas that is blown out from the sealing box 505A. In other words, the instability (unevenness) of the local atmosphere that is formed over the substrate 2 is increased.

Regarding this point, it is difficult to make control for suppressing the instability of the local atmosphere caused by the blowing of the nitrogen gas from the large sealing box 505A to the substrate 2. This is because it is difficult to evenly blow out the nitrogen gas from the entire opening OP that is arranged below the sealing box 505A because of the increase in the size of the sealing box 505A, and thus, the increase in the stability of the local atmosphere caused by the blowing of the nitrogen gas has very high technical difficulty (hurdle).

Accordingly, in the present first embodiment, the control for the local atmosphere according to the very high technical difficulty is purposely avoided, and an approach from a different point of view is made so that the light-transmittable member 4 is arranged on the amorphous silicon film 3A on the basis of the concept for preventing the surface of the amorphous silicon film 3A from being affected by the instable atmosphere. In other words, in consideration of the reduction in the evenness (the variation in the crystal grains) of the polysilicon film due to the direct contact between the instable atmosphere and the amorphous silicon film 3A, the technical concept of the present first embodiment is made based on thoughts that the formation of the local atmosphere that is difficult to be controlled is purposely avoided while it is only necessary to block the direct contact between the instable atmosphere and the amorphous silicon film 3A. More specifically, this technical concept is embodied by the configuration (the feature) in which the laser light is emitted to the amorphous silicon film 3A while the light-transmittable member 4 is arranged on the amorphous silicon film 3A.

When the steps for manufacturing the panel (display apparatus) including the thin film transistor are achieved by using such a laser processing apparatus 1000 according to the present first embodiment, the characteristics of the thin film transistor having the polysilicon film as the channel film can be improved, so that the performance of the display apparatus can be improved.

Further, the present first embodiment can also provide the following advantage when being different from the configuration of the laser processing apparatus 500 of the "local atmosphere type" (see FIG. 9) that is applied in the related art. More specifically, in the laser processing apparatus 1000 according to the present first embodiment, the sealing box 505A for use in the blowing of the nitrogen gas to the substrate 2 is unnecessary. As a result, the closed enclosure 504 is also unnecessary, so that the entire apparatus can be simplified and downsized.

Since the sealing box 505A is unnecessary, maintenance work as exemplified by a periodic replacement of the sealing box 505A is also unnecessary. As a result, in the laser processing apparatus 1000 according to the present first embodiment, a productivity of the display apparatus can be improved, and a cost of the laser processing apparatus 1000 itself can be reduced.

When the "substrate structural object 50" is carried in or out of the processing chamber 505 of the laser processing apparatus 1000, it is necessary to open the processing chamber 505. In this case, the atmosphere inside the processing chamber 505 is disturbed since air enters from outside. However, in the laser processing apparatus 1000 according to the present first embodiment, even when the atmosphere inside the processing chamber 505 is disturbed, the laser processing apparatus 1000 can be operated without the securement of waiting time taken for stabling the atmosphere regardless of the disturbance of the atmosphere since the light-transmittable member 4 for use in blocking the contact of the atmosphere is arranged on the amorphous silicon film 3A. In the manner, according to the method for manufacturing the panel using the laser processing apparatus 1000, a throughput can be improved.

Further, since the light-transmittable member 4 is arranged on the amorphous silicon film 3A in the laser processing apparatus 1000 according to the present first embodiment, the particles can be also prevented from adhering on the amorphous silicon film 3A. In other words, the light-transmittable member 4 is essentially arranged for the emission of the laser light to the amorphous silicon film 3A while blocking the direct contact between the instable atmosphere and the amorphous silicon film 3A. At the same time, as described above, the light-transmittable member 4 also has, for example, an incidental function of suppressing the particles from adhering on the amorphous silicon film 3A, the particles being caused due to the laser processing apparatus 1000.

Since the light-transmittable member 4 is detached from the substrate 2 after the laser annealing process is performed to the amorphous silicon film 3A by using the laser processing apparatus 1000 according to the present first embodiment, the particles caused due to the laser processing apparatus 1000 can be prevented from adversely affecting the subsequent steps for manufacturing the panel. In the manner, according to the steps for manufacturing the panel using the laser processing apparatus 1000 according to the present first embodiment, an yield of the display apparatus as a finished product can be improved.

As the light-transmittable member 4, for example, a mother glass that has not been subjected to any treatment can be used. This manner can provide an advantage that eliminates the need for another manufacturing of the light-transmittable member 4. However, the light-transmittable member 4 is not limited to be made of the mother glass, and can be widely made of a member having a light transmittance of the laser light.

<Additional Devisal>

Next, additional devisal will be explained. In the laser processing apparatus 1000 according to the present first embodiment, for example, the sealing box is unnecessary as shown in FIG. 10. Therefore, a vacant space 510 is formed in an upper space of the "substrate structural object 50" where the sealing box is originally arranged. Accordingly, it is desirable to effectively utilize this vacant space 510.

Incidentally, since the light-transmittable member 4 is arranged on the amorphous silicon film 3A in the present first embodiment, the present first embodiment can effectively suppress the reduction in the evenness (the variation in the crystal grains) of the polysilicon film due to the direct contact between the instable atmosphere and the amorphous silicon film 3A.

Meanwhile, since the laser light is emitted to the amorphous silicon film 3A through the light-transmittable member 4, the laser light is reflected on the light-transmittable member 4. This means that the present first embodiment has a room for further improvement as to usage of the energy of the laser light for the heating of the amorphous silicon film 3A. In other words, by the reflection of the laser light on the light-transmittable member 4, the energy of the laser light that is used for the heating of the amorphous silicon film 3A is reduced. Accordingly, it is also desirable to effectively utilize the reflection light on the light-transmittable member 4.

As described above, in consideration of the effective utilization of the vacant space 510 and the effective utilization of the reflection light on the light-transmittable member 4, the following first and second modification examples are thought up.

First Modification Example

Figure 11:
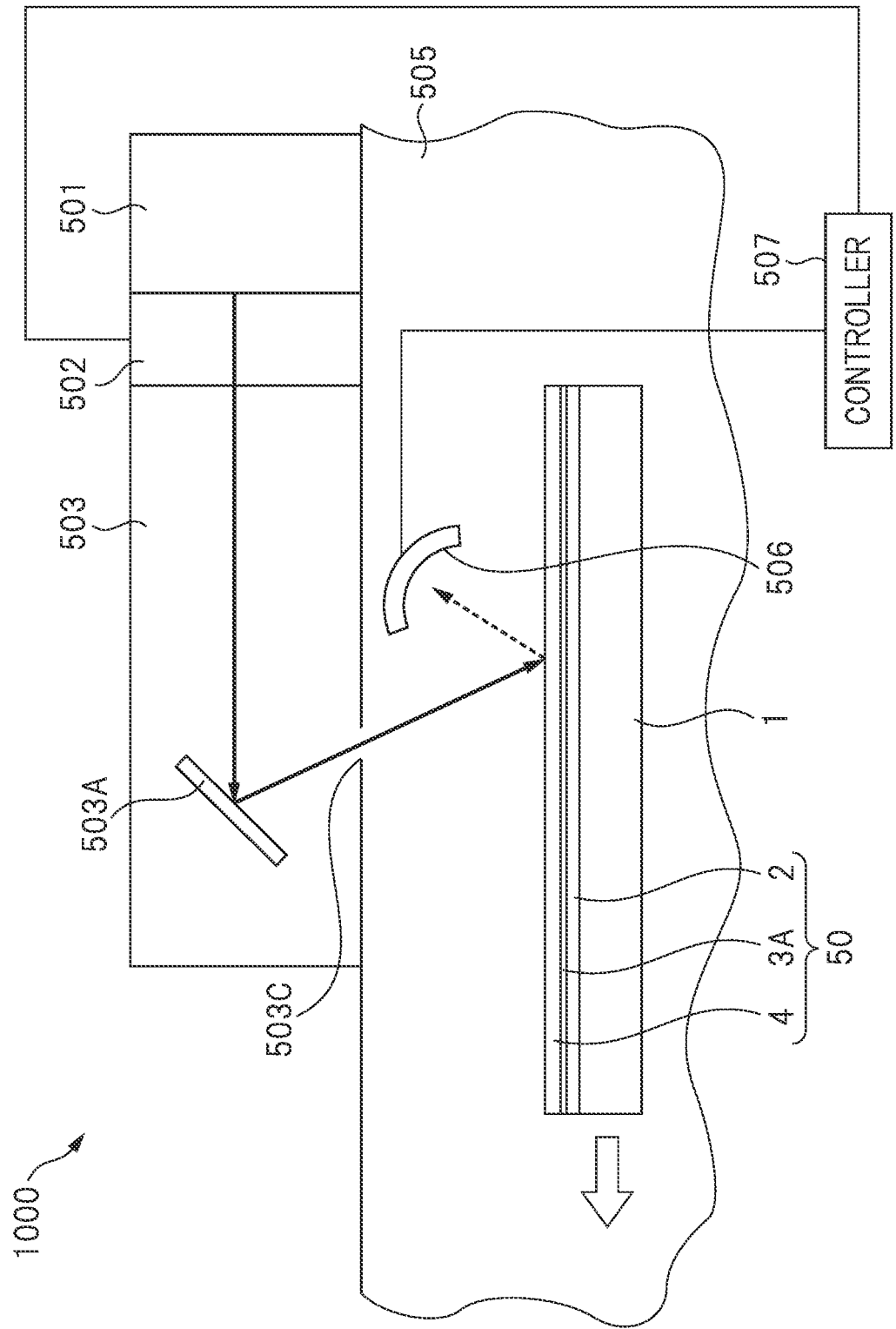

FIG. 11 is a diagram showing a schematic configuration of a laser processing apparatus according to the present first modification example.

A configuration of the laser processing apparatus 1000 according to the present first modification example (see FIG. 11) is almost the same as the configuration of the laser processing apparatus 1000 according to the first embodiment (see FIG. 10), and therefore, differences will be mainly explained.

In the laser processing apparatus 1000 according to the present first modification example in FIG. 11, a measuring device 506 for use in measuring the energy of the reflection light of the laser light reflected on the "substrate structural object 50" is arranged in the vacant space that is formed by the removal of the unnecessary sealing box. In other words, the measuring device 506 is arranged above the carrying stage 1. This measuring device 506 is electrically connected to a controller 507 that can control the energy of the laser light on the basis of an output value of the measuring device 506. This controller 507 can be arranged, for example, inside the laser processing apparatus 1000. However, the present invention is not limited to this arrangement, and the controller may be arranged out of the laser processing apparatus 1000. As shown in FIG. 11, this controller 507 is configured to be connected to the light attenuator 502, and to adjust the light transmittance of the laser light in the light attenuator 502, so that the output of the laser light is controllable.

Figure 12:
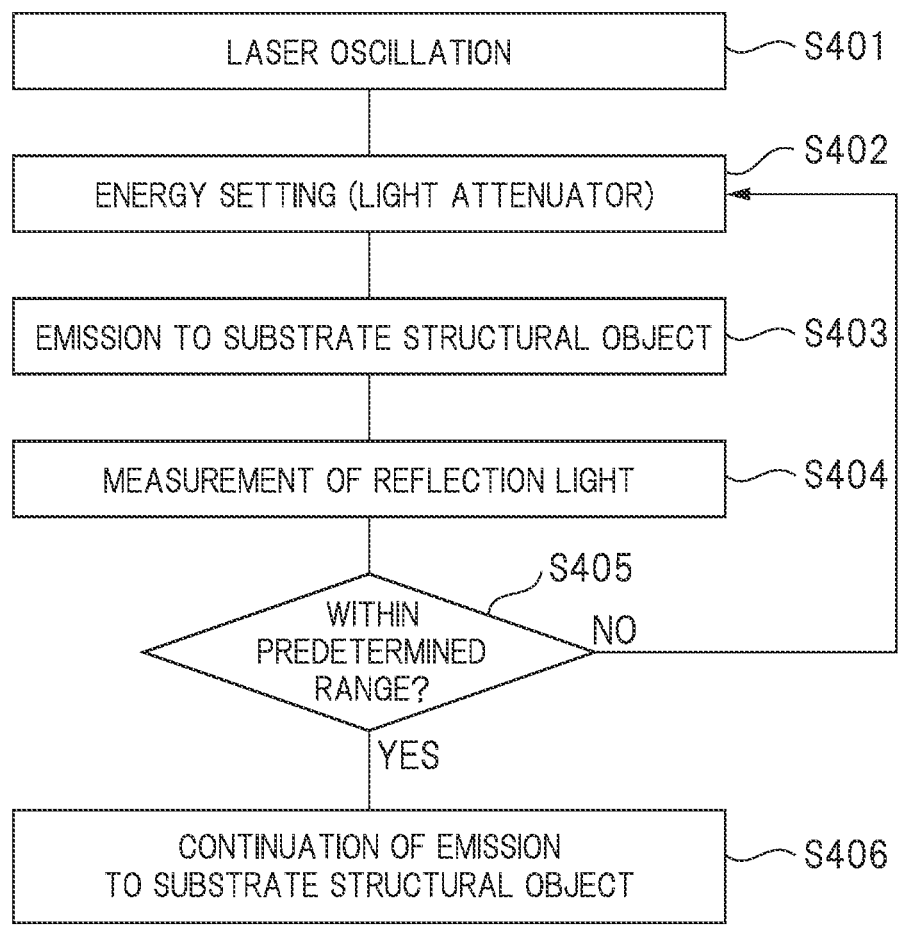

The laser processing apparatus 1000 according to the present first modification example is configured as described above, and a specific operation of the laser processing apparatus 1000 according to the present first modification example will be explained below with reference to the drawings. FIG. 12 is a flowchart for explaining the specific operation of the laser processing apparatus according to the first modification example. First, in FIG. 11, the light-transmittable member 4 that can transmit the laser light is arranged on the substrate 2 having the amorphous silicon film 3A that is the non-crystalline semiconductor film formed on its upper surface. Then, the laser light is generated (the laser is oscillated) in the laser light generator 501 (S401). Next, in FIG. 11, the laser light that has been output from the laser light generator 501 is input to the light attenuator 502. At this time, the light transmittance of the laser light in the light attenuator 502 is previously set by the controller 507 that is electrically connected to the light attenuator 502. In other words, by the controller 507, the energy of the laser light that is output from the light attenuator 502 is set in a predetermined range (S402). Then, the laser light having the light output that has been adjusted by the light attenuator 502 is input to the optical system module 503. By a lens system arranged inside the optical system module 503, the laser light that has been input to the optical system module 503 is shaped into the linear-beam shaped laser light. The linear-beam shaped laser light is reflected by, for example, a reflection mirror 503A that is arranged inside the optical system module 503, and then, is input to the processing chamber 505 through the opening 503C. The laser light that has been input to the processing chamber 505 travels in the internal space of the processing chamber 505, and then, is emitted to the "substrate structural object 50" that is arranged on the carrying stage 1 (S403). More specifically, the laser light is emitted to the amorphous silicon film 3A that is formed on the surface of the substrate 2, through the light-transmittable member 4 configuring a part of the "substrate structural object 50".

In this case, a part of the laser light is reflected by the "substrate structural object 50". The reflection light that has been reflected by the "substrate structural object 50" is input to the measuring device 506 that is arranged in the vacant space formed by the removal of the sealing box. Then, in the measuring device 506, the energy of the reflection light is measured (S404). Next, from the measuring device 506, data (a value) corresponding to the energy of the reflection light is output to the controller 507. At this time, the controller 507 to which the data (value) has been input from the measuring device 506 determines whether this data is within the predetermined range (S405). If the data that has been output from the measuring device 506 is within the predetermined range, the controller 507 determines that the laser light having the set energy is being emitted to the "substrate structural object 50", and continues to emit the laser light to the "substrate structural object 50" (S406). On the other hand, if the data that has been output from the measuring device 506 is out of the predetermined range, the controller 507 determines that the laser light having the set energy is not being emitted to the "substrate structural object 50" (S405), and changes the setting for the light transmittance of the laser light in the light attenuator 502 into a new setting. More specifically, if the data that has been output from the measuring device 506 is higher than an upper limit value of the predetermined range, the controller 507 changes the setting so that the light transmittance of the laser light in the light attenuator 502 becomes small. On the other hand, if the data that has been output from the measuring device 506 is lower than a lower limit value of the predetermined range, the controller 507 changes the setting so that the light transmittance of the laser light in the light attenuator 502 becomes large. In the manner, according to the first modification example, the reflection light on the light-transmittable member 4 can be also effectively utilized at the same time as the effective utilization of the vacant space. More specifically, according to the first modification example, the measuring device 506 is arranged in the vacant space, and the controller 507 for use in controlling the light transmittance of the laser light in the light attenuator 502 is arranged on the basis of the output of the measuring device 506, so that the laser light having the set energy can be emitted to the "substrate structural object 50".

Second Modification Example

Subsequently, a second modification example of the first embodiment will be explained.

Figure 13:
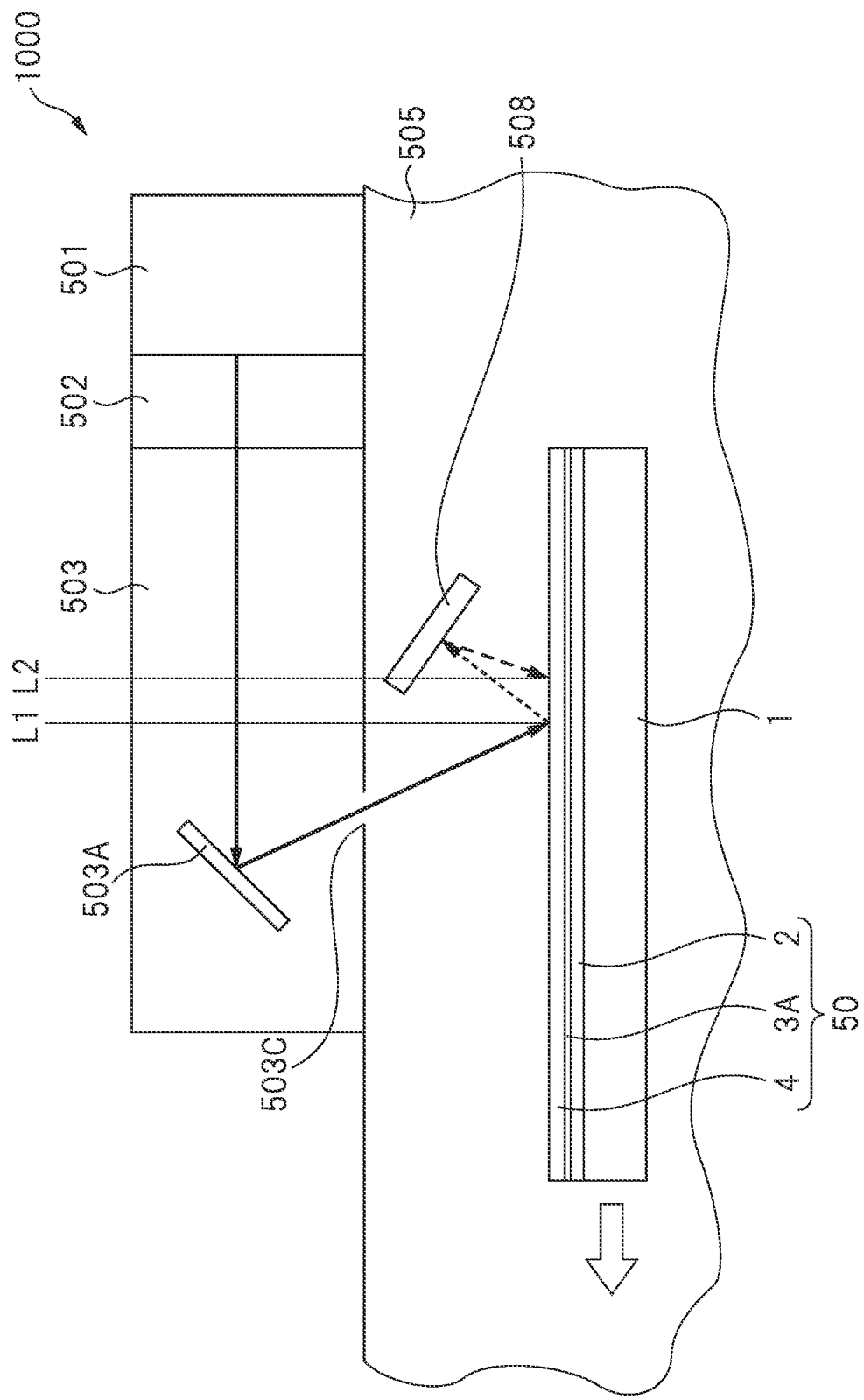

FIG. 13 is a diagram showing a schematic configuration of a laser processing apparatus according to the present second modification example.

A configuration of the laser processing apparatus 1000 according to the present second modification example (see FIG. 13) is almost the same as the configuration of the laser processing apparatus 1000 according to the first embodiment (see FIG. 10), and therefore, differences will be mainly explained.

In the laser processing apparatus 1000 according to the present second modification example in FIG. 13, a reflection mirror 508 that further reflects the reflection light of the laser light reflected on the "substrate structural object 50" to the "substrate structural object 50" is arranged in the vacant space that is formed by the removal of the unnecessary sealing box. In other words, the reflection mirror 508 is arranged above the carrying stage 1. This reflection mirror 508 is arranged at an angle that allows the "substrate structural object 50" to be preheated by the laser light that is reflected by the reflection mirror 508. More specifically, as shown in FIG. 13, the angle of and the position of the reflection mirror 508 are adjusted so that the laser light that is reflected by the reflection mirror 508 is emitted to a position L2 that is farther in a carrying direction (arrow direction) of the carrying stage 1 than a position L1 at which the laser light is emitted to the "substrate structural object 50".

The laser processing apparatus 1000 according to the present second modification example is configured as described above, and an operation of the laser processing apparatus 1000 according to the present second modification example will be explained below with reference to the drawings. First, in FIG. 13, the light-transmittable member 4 that can transmit the laser light is arranged on the substrate 2 having the amorphous silicon film 3A that the amorphous semiconductor film formed on its upper surface. Then, the laser light is generated in the laser light generator 501. Next, in FIG. 13, the laser light that has been output from the laser light generator 501 is input to the light attenuator 502. Then, the laser light having the light output that has been adjusted by the light attenuator 502 is input to the optical system module 503. By a lens system arranged inside the optical system module 503, the laser light that has been input to the optical system module 503 is shaped into the linear-beam shaped laser light. The linear-beam shaped laser light is reflected by, for example, a reflection mirror 503A that is arranged inside the optical system module 503, and then, is input to the processing chamber 505 through the opening 503C. The laser light that has been input to the processing chamber 505 travels in the internal space of the processing chamber 505, and then, is emitted to a position R1 of the "substrate structural object 50" that is arranged on the carrying stage 1. More specifically, the laser light is emitted to the position R1 of the amorphous silicon film 3A that is formed on the surface of the substrate 2, through the light-transmittable member 4 configuring a part of the "substrate structural object 50". In the manner, at the position R1 of the amorphous silicon film 3A, the amorphous silicon film 3A is heated, and is changed into the polysilicon film. In this case, as shown in FIG. 13, a part of the laser light that has been emitted to the position R1 of the amorphous silicon film 3A is reflected by the "substrate structural object 50", and is input to the reflection mirror 508. Then, the reflection light (laser light) that has been reflected by the reflection mirror 508 is emitted to a position R2 of the "substrate structural object 50" arranged on the carrying stage 1. As a result, a portion at the position R2 of the amorphous silicon film 3A that is formed on the surface of the substrate 2 is preheated. In other words, since an intensity of the laser light (reflection light) to be emitted to the position R2 is smaller than an intensity of the laser light to be emitted to the position R1, a heat quantity that is smaller than a necessary heat quantity for changing the amorphous silicon film 3A into the polysilicon film is applied onto the position R2 of the amorphous silicon film 3A (in preheating).

Then, when the carrying stage 1 on which the "substrate structural object 50" is arranged moves in the arrow direction in FIG. 13, the preheated portion at the position R2 of the amorphous silicon film 3A moves to the position R1, and the laser light is emitted to the portion. As a result, at the position R1 after the moving, sufficient heating is applied to the preheated portion of the amorphous silicon film 3A, that has been preheated at the position R2, so that the portion is changed into the polysilicon film.

In the manner, also in the present second modification example, the reflection light on the "substrate structural object 50" can be also effectively utilized at the same time as the effective utilization of the vacant space. More specifically, in the present second modification example, the preheating is performed by using the reflection mirror 508 to re-emit the laser light (reflection light) that has been reflected on the "substrate structural object 50" to the "substrate structural object 50", and therefore, an energy density of the laser light that is necessary for obtaining favorable crystals can be reduced. As a result, a wider linear beam can be formed by an energy density of the excess laser light, and therefore, a processing speed can be improved. In other words, in the laser processing apparatus 1000 according to the present second modification example, a throughput can be improved.

Third Modification Example

In the present third modification example, devisal of a carrying stage will be explained.

Figure 14:
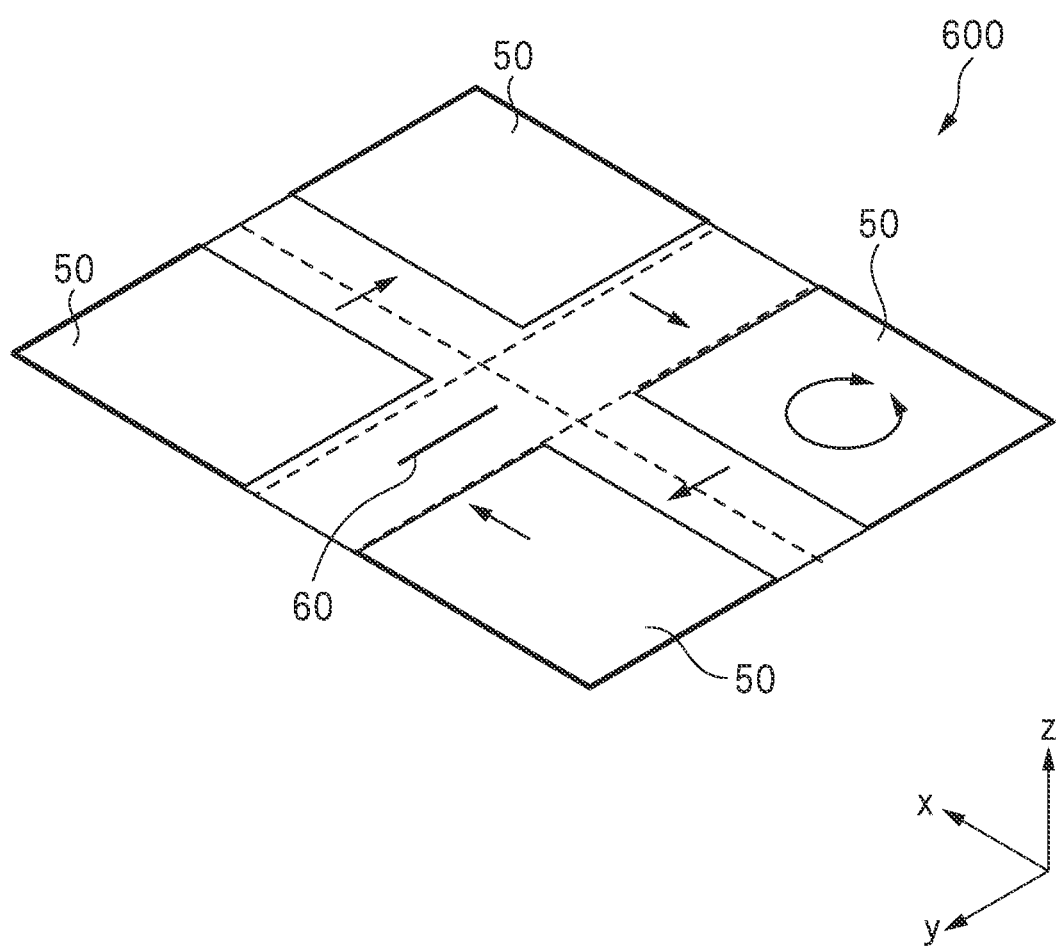

FIG. 14 is a diagram showing a schematic appearance configuration of a carrying stage that is used in the laser processing apparatus according to the present third modification example. As shown in FIG. 14, a carrying stage 600 according to the present third modification example has a large planar size that allows a plurality of the "substrate structural objects 50" to be arranged therein, and the plurality of the "substrate structural objects 50" that are arranged on the carrying stage 600 are carried while being floated above the fixed carrying stage 600.

For example, the carrying stage 1 according to the first embodiment shown in FIG. 10 has a planar size that allows single "substrate structural object 50" to be arranged therein, and the carrying stage 1 itself is configured to be movable in the arrow direction together with the "substrate structural object 50" placed on the carrying stage 1. In the manner, the carrying stage 1 on which the "substrate structural object 50" is placed moves in the arrow direction, and the entire "substrate structural object 50" can be scanned with the linear-beam shaped laser light.

On the other hand, the carrying stage 600 according to the third modification example shown in FIG. 14 is fixed as different from the carrying stage 1 according to the first embodiment shown in FIG. 10. And, the plurality of "substrate structural objects 50" (four "substrate structural objects 50" are illustrated in FIG. 14) are arranged on the fixed carrying stage 600, and the plurality of "substrate structural objects 50" are configured to be movable in, for example, an arrow direction of FIG. 14 while being floated above the carrying stage 600. FIG. 14 illustrates linear-beam shaped laser light 60. When the plurality of "substrate structural objects 50" that are carried while being floated above the carrying stage 600 pass over a position to which this laser light 60 is emitted, the laser light 60 is emitted to the amorphous silicon film configuring a part of the "substrate structural objects 50". In the manner, the plurality of "substrate structural objects 50" that are carried while being floated can be scanned with the laser light 60.

When the carrying stage 1 according to the first embodiment is used, only the single "substrate structural object 50" is carried into the laser processing apparatus. Therefore, at the time of replacement of the "substrate structural object 50", the laser annealing process cannot be performed. On the other hand, when the carrying stage 600 according to the present third modification example is used, the plurality of "substrate structural objects 50" are simultaneously carried into the laser processing apparatus. Therefore, the laser annealing process is successively performed to the plurality of "substrate structural objects 50" that have been simultaneously carried in. As a result, in the laser processing apparatus using the carrying stage 600 according to the present third modification example, a throughput can be improved more than that of the laser processing apparatus using the carrying stage 1 according to the first embodiment.

Figure 15:
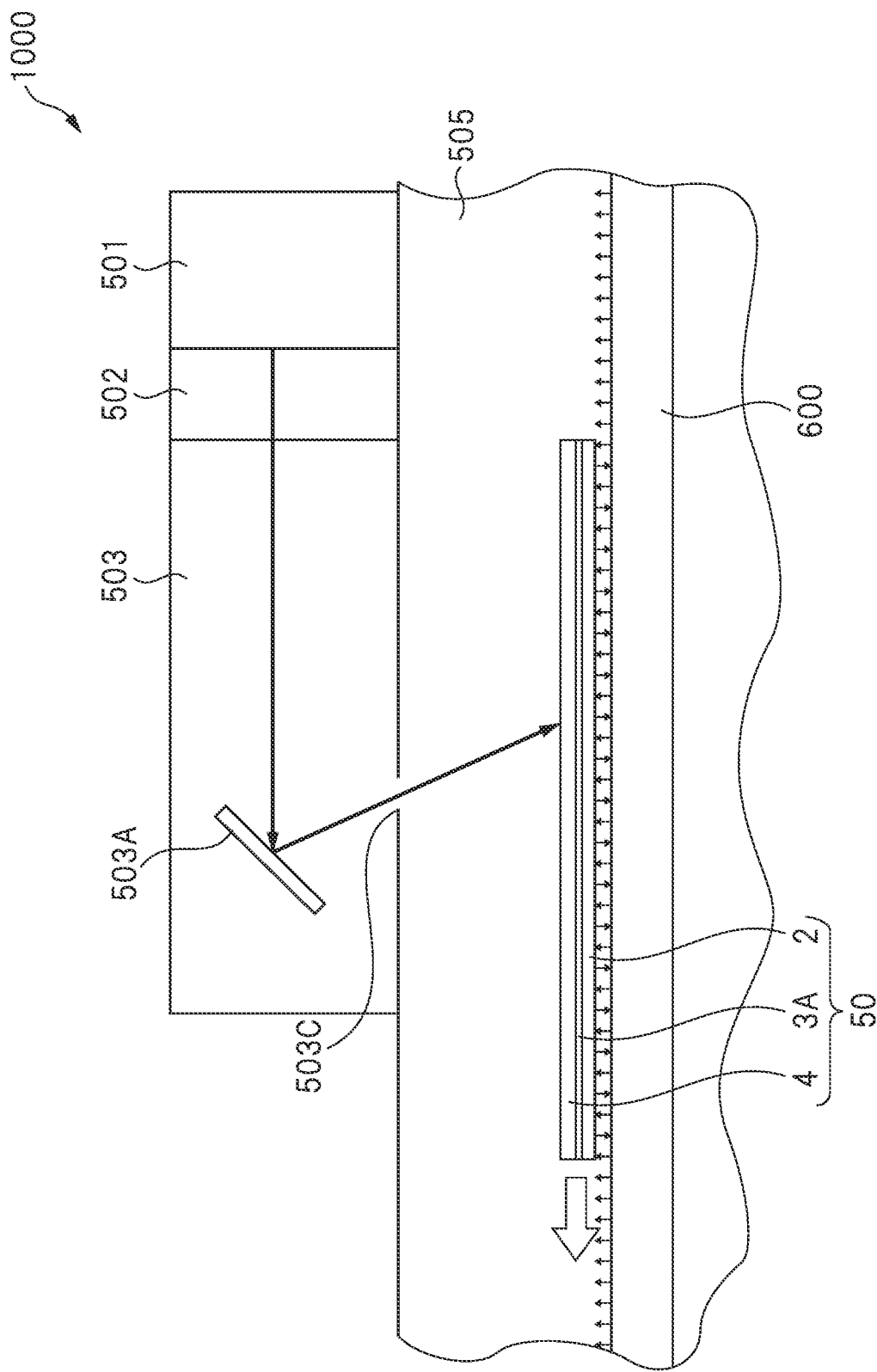

FIG. 15 is a diagram schematically showing the laser processing apparatus using the carrying stage according to the present third modification example. As shown in FIG. 15, in the laser processing apparatus 1000 using the carrying stage 600 according to the present third modification example, the "substrate structural objects 50" are configured to be carried in the arrow direction while being floated above the carrying stage 600 by the gas that is blown out from a surface of the carrying stage 600. In the manner, the laser light can be emitted to the "substrate structural objects 50" that are carried in the arrow direction while being floated above the carrying stage 600.

Second Embodiment

<Findings on Laser Processing>

First, phenomena caused when the amorphous silicon film is changed into the polysilicon film by the emission of the laser light onto the amorphous silicon film will be explained.

Figure 16:
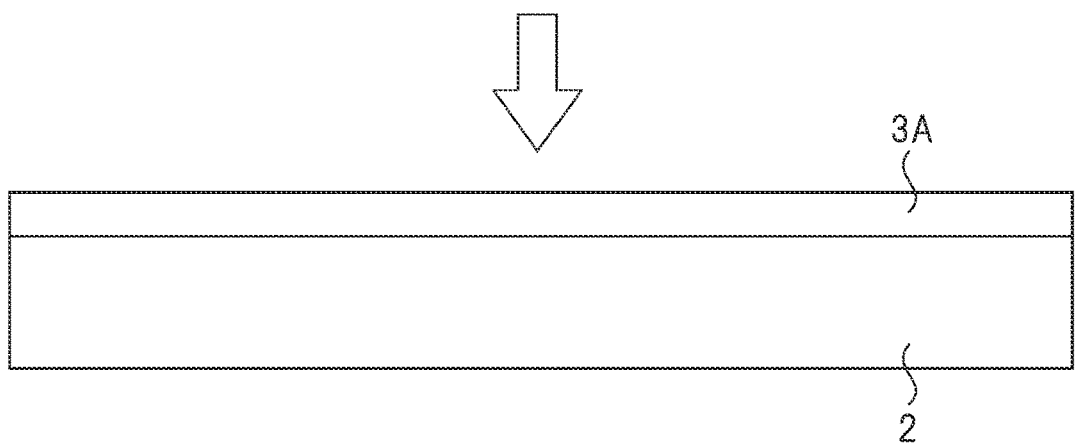
Figure 17:
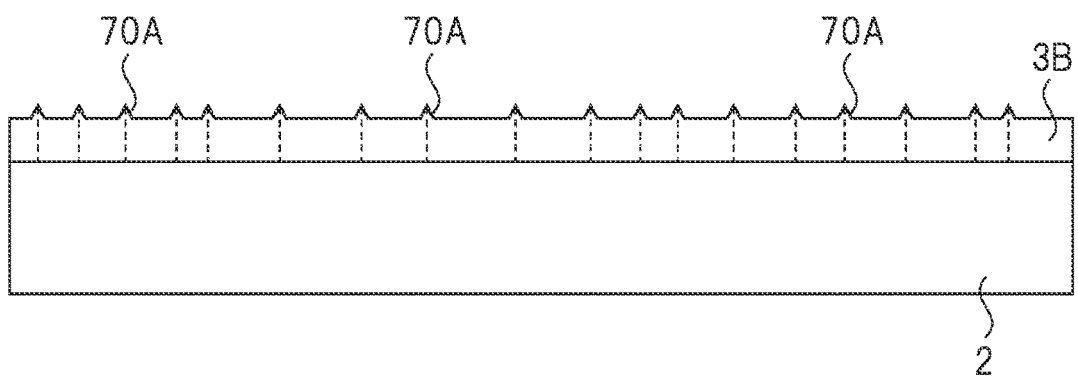

FIG. 16 shows a state of the emission of the laser light (shown with an arrow) onto the amorphous silicon film 3A that is formed on the substrate 2. In this case, when the laser light is emitted onto the amorphous silicon film 3A, the amorphous silicon film 3A absorbs the energy of the laser light and is heated. As a result, the amorphous silicon film 3A is changed into the polysilicon film. At this time, the laser light to be, for example, a plurality of pulses, is emitted onto the amorphous silicon film 3A. In this case, FIG. 17 schematically shows a state in which a polysilicon film 3B is formed by emission of, for example, first several pulses onto the amorphous silicon film 3A. In FIG. 17, at a stage of the emission of the first several pulses, small protrusions 70A with less periodicity are formed on a surface of the polysilicon film 3B. In other words, by the emission of the laser light onto the amorphous silicon film 3A, the crystal grains are grown well at positions where the light is enhanced by each other because of interference effect of the laser light. As a result, the small protrusions 70A are formed on the surface of the polysilicon film 3B so as to correspond to the light-enhanced positions. In other words, in the change from the amorphous silicon film 3A into the polysilicon film 3B, the small protrusions 70A are formed on the surface of the polysilicon film 3B, and the small protrusions 70A are formed along a grain boundary among the crystal grains. Regarding this point, at the stage of the emission of the first several pulses, the periodicity among the formation positions of the small protrusions 70A is low. Therefore, in consideration of the fact that the grain boundary among the crystal grains is defined by the small protrusions 70A, the low periodicity means that the evenness of the crystal grains that are formed in the polysilicon film 3B is low at the stage of the emission of the first several pulses. This may be because periodicity among the light-enhanced positions does not clearly appear at the stage of the emission of only the first several pulses.

Figure 18:
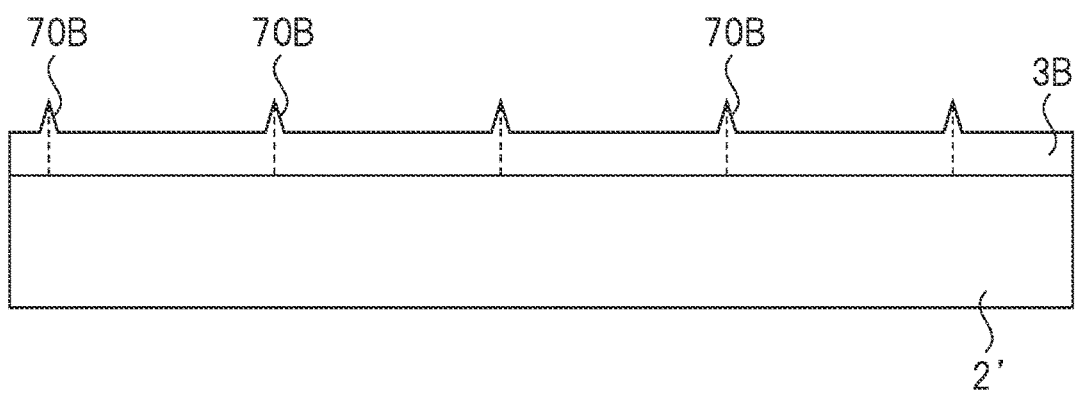

However, increase in the number of the emitted pulses clarifies the appearance of the periodicity among the light-enhanced positions, and the periodicity among the formation positions of the protrusions 70B becomes high as shown in, for example, FIG. 18. In other words, the increase in the number of the emitted pulses increases the periodicity among the protrusions 70B that are grown on the surface of the polysilicon film 3B. In the manner, the evenness of the crystal grains configuring the polysilicon film 3B is improved.

From such phenomena, it is found that the emission of the light pulse onto the amorphous silicon film 3A changes the amorphous silicon film 3A into the polysilicon film 3B, and forms the protrusions on the surface of the polysilicon film 3B. And, it is found that the evenness of the crystal grains configuring the polysilicon film 3B is increased by the growth of the protrusions from the small protrusions 70A to the protrusions 70B. In other words, it is expected that there is a certain correlation between a size of each protrusion and the evenness of the crystal grains. Further, it is found that the increase in the number of the emitted pulses clarifies the appearance of the light-enhanced positions, which results in the growth of the protrusions from the small protrusions 70A with the low periodicity to the protrusions 70B with high periodicity. On the basis of such findings, it is desirable to set the number of the emitted pulses to be a plurality of pulses in order to improve the evenness of the crystal grains configuring the polysilicon film 3B.

In this case, in the above-described first embodiment, for example, the amorphous silicon film 3A that is formed on the substrate 2 and the light-transmittable member 4 are adhered to each other as shown in FIG. 10. This technique means that the configuration of the "substrate structural object 50" of the above-described first embodiment is difficult to grow the protrusions that are formed when the amorphous silicon film 3A is changed into the polysilicon film, since the amorphous silicon film 3A and the light-transmittable member 4 are adhered to each other. Further, the difficulty in the growth of the protrusions means that it is difficult to improve the evenness of the crystal grains configuring the polysilicon film in consideration of the above-described findings. Besides, the difficulty in the improvement of the evenness of the crystal grains configuring the polysilicon film means that an electric-current driving power of the thin film transistor using this polysilicon film as the channel film cannot be improved. This is because the low evenness of the crystal grains configuring the polysilicon film means a low mobility in the polysilicon film, and thus, means a low electric-current driving power of the thin film transistor. Therefore, it is also thought that the configuration of the "substrate structural object 50" according to the above-described first embodiment is not the best configuration for improving the characteristics of the thin film transistor.

However, for an intended use that does not request the improvement of the mobility in the thin film transistor so much, even the configuration of the "substrate structural object 50" according to the above-described first embodiment sufficiently becomes an effective technical concept. More specifically, for a large-screen television assumed as the display apparatus, the technical concept of the above-described first embodiment is effective. This is because a gate width of the thin film transistor in the large-screen television can be simply designed to be large since the size of the thin film transistor is not so small, which results in the improvement of the electric-current driving power of the thin film transistor because of the large gate width even without the large mobility in the channel film of the thin film transistor.

On the other hand, fora smartphone having a small size assumed, additional devisal is necessary in the technical concept of the above-described first embodiment. This is because the gate width of the thin film transistor in the smartphone having the small size is difficult to be simply designed to be large since it is necessary to make the thin film transistor small. In other words, this is because it is difficult to apply the technique of making the gate width large in order to improve the electric-current driving power of the thin film transistor that is formed in the smartphone, which results in the need for the improvement of the mobility in the polysilicon film configuring the channel film of the thin film transistor. That is, in order to improve the electric-current driving power of the thin film transistor that is formed in the smartphone, it is necessary to improve the mobility by improving the evenness of the crystal grains configuring the polysilicon film as much as possible.

Accordingly, for an intended use in a small mobile communication device such as a smartphone, it is necessary to further improve the technical concept of the above-described first embodiment. A technical concept of the present second embodiment applying additional devisal for increasing the evenness of the crystal grains configuring the polysilicon film on the basis of the technical concept of the above-described first embodiment will be explained below with reference to the drawings.

Feature of Second Embodiment

Figure 19:
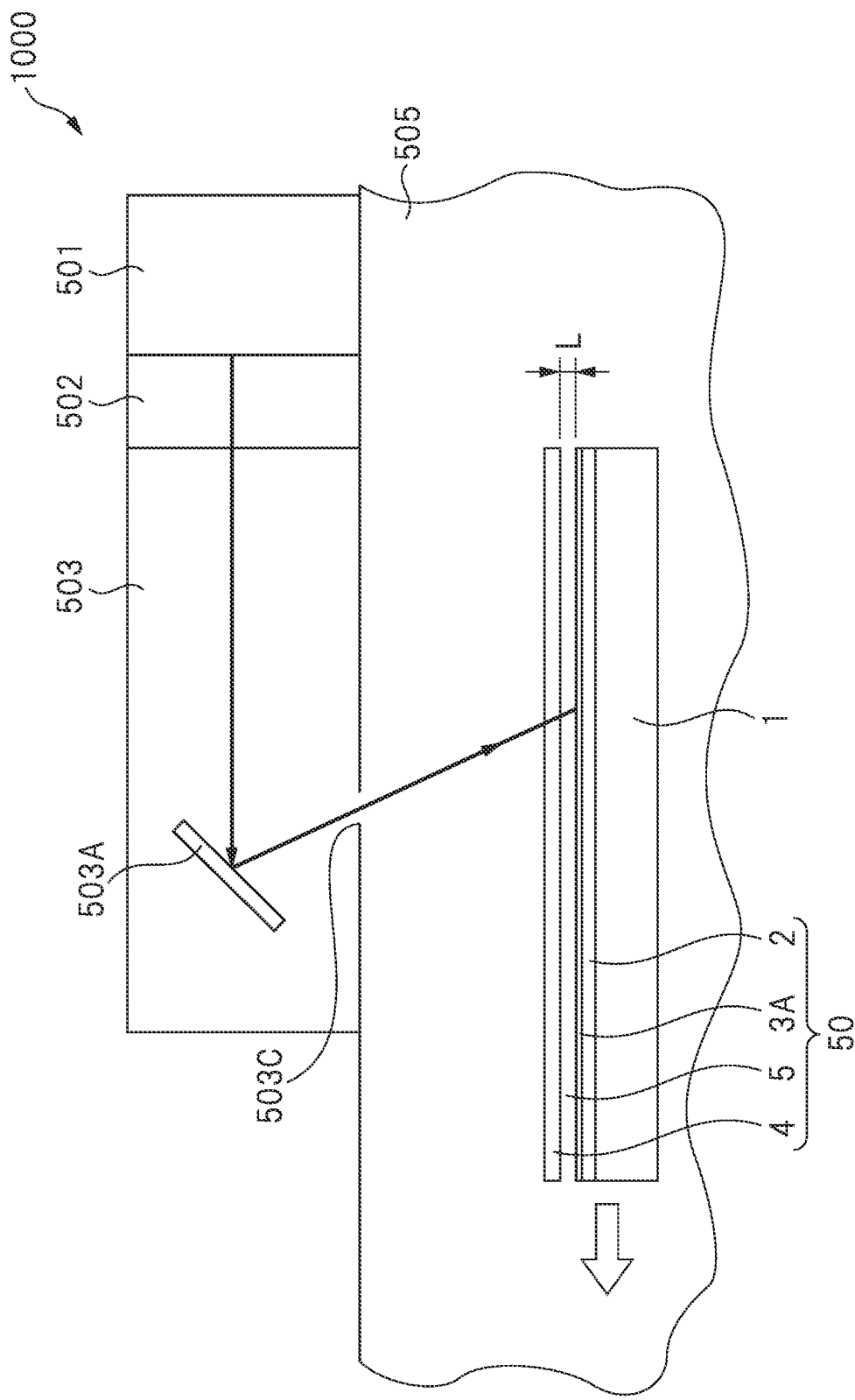

FIG. 19 is a diagram showing a schematic configuration of a laser processing apparatus according to the present second embodiment.

A configuration of a laser processing apparatus 1000 according to the present second embodiment (see FIG. 19) is almost the same as the configuration of the laser processing apparatus 1000 according to the above-described first embodiment (see FIG. 10), and therefore, differences will be mainly explained.

A feature of the present second embodiment is that, for example, a gap 5 is formed between the amorphous silicon film 3A that is formed on the substrate 2 and the light-transmittable member 4 that is arranged above the amorphous silicon film 3A as shown in FIG. 19. In other words, the feature of the present second embodiment is that the "substrate structural object 50" is made of the substrate 2, the amorphous silicon film 3A that is formed on this substrate 2, and the light-transmittable member 4 that is arranged above the amorphous silicon film 3A through the gap 5. In the manner, according to the present second embodiment, the protrusions that are formed when the amorphous silicon film 3A is changed in to the polysilicon film can be grown in the gap 5. In other words, in the present second embodiment, the gap 5 is formed between the amorphous silicon film 3A and the light-transmittable member 4, so that this gap 5 becomes a space where the protrusions are grown. As a result, according to the present second embodiment, the protrusions are easy to be grown, and therefore, the evenness of the crystal grains configuring the polysilicon film can be improved. The easiness in the improvement of the evenness of the crystal grains configuring the polysilicon film means that the electric-current driving power of the thin film transistor using this polysilicon film as the channel film is improved. This is because the improvement of the evenness of the crystal grains configuring the polysilicon film means the improvement of the mobility in the polysilicon film, and thus, means the improvement of the electric-current driving power of the thin film transistor. Therefore, by the configuration of the "substrate structural object 50" having the gap 5 according to the present second embodiment, the characteristics of the thin film transistor can be improved. Particularly in the small mobile communication device as exemplified by the smartphone, it is important to improve the mobility in the channel film of the thin film transistor as described above in order to improve the characteristics of the thin film transistor. Regarding this point, when the laser annealing step (laser processing step) is performed by the laser processing apparatus 1000 using the "substrate structural object 50" according to the present second embodiment, the evenness of the crystal grains of the polysilicon film that is the channel film of the thin film transistor can be improved, and therefore, the mobility in the polysilicon film can be improved. As a result, according to the present second embodiment, the performance of the display apparatus can be improved particularly by the improvement of the characteristics of the thin film transistor for use in the small mobile communication device (display apparatus).

In this case, in FIG. 19, a height L of the gap 5 formed between the amorphous silicon film 3A and the light-transmittable member 4 (that is a distance between the amorphous silicon film 3A and the light-transmittable member 4) is desirably larger than a thickness of the amorphous silicon film 3A. This is because, when the height L of the gap 5 is about equal to or smaller than the thickness of the amorphous silicon film 3A, undesirable interference that tends to occur due to multireflection of the laser light on this gap 5 becomes a cause of disturbance of the periodicity among the protrusions. On the other hand, when the height L of the gap 5 is much larger than the thickness of the amorphous silicon film 3A, obvious interference is difficult to occur, and the interference disturbing the periodicity among the protrusions is difficult to occur, and therefore, the height L of the gap 5 that is formed between the amorphous silicon film 3A and the light-transmittable member 4 is desirably larger than the thickness of the amorphous silicon film 3A.

<Specific Configuration Example of "Substrate Structural Object 50">

Next, a configuration example of the "substrate structural object 50" according to the present second embodiment will be explained.

Figure 20:
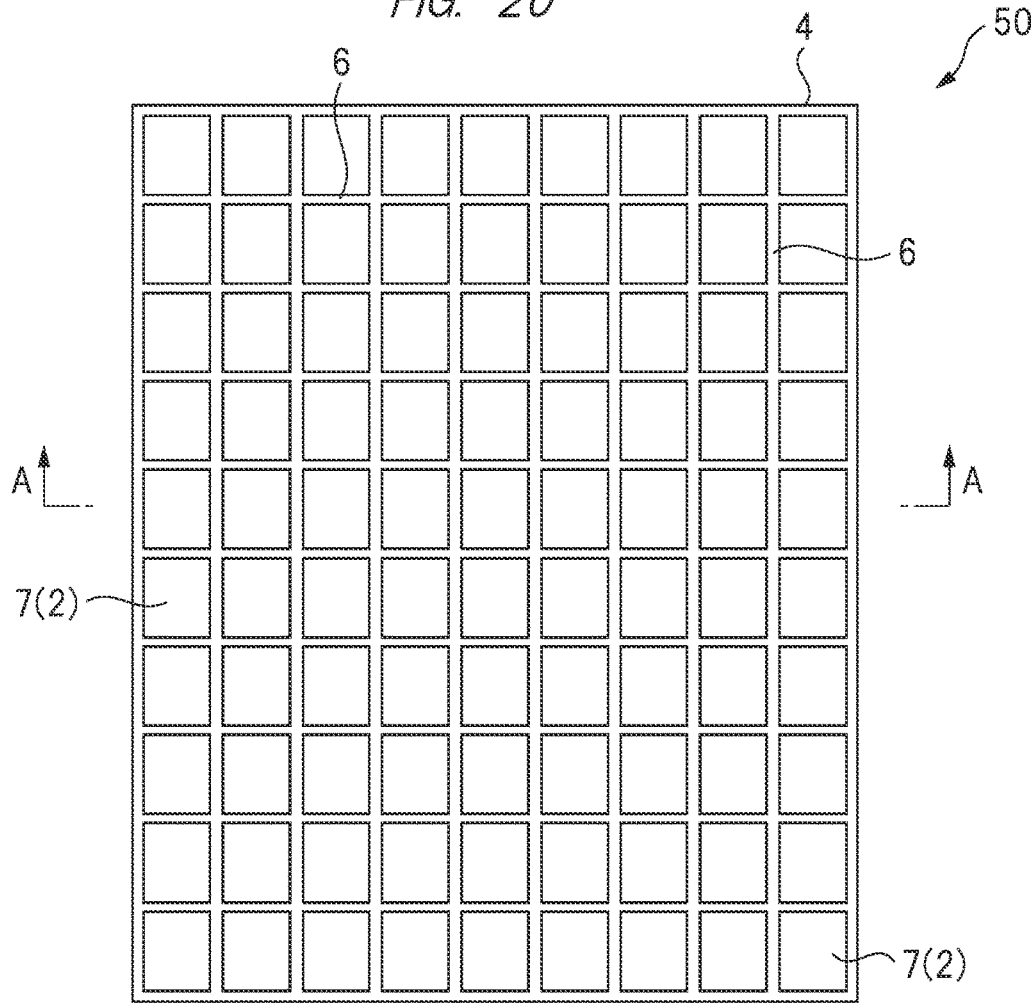

FIG. 20 is a planar view showing a schematic configuration of the "substrate structural object 50" according to the present second embodiment. As shown in FIG. 20, in the "substrate structural object 50" according to the present second embodiment, mesh-arranged protrusions 6 are formed in a lower layer of the light-transmittable member 4 having a rectangular planar shape, and the substrate 2 is partitioned into a plurality of panel regions 7 by the mesh-arranged protrusions 6.

Figure 21:
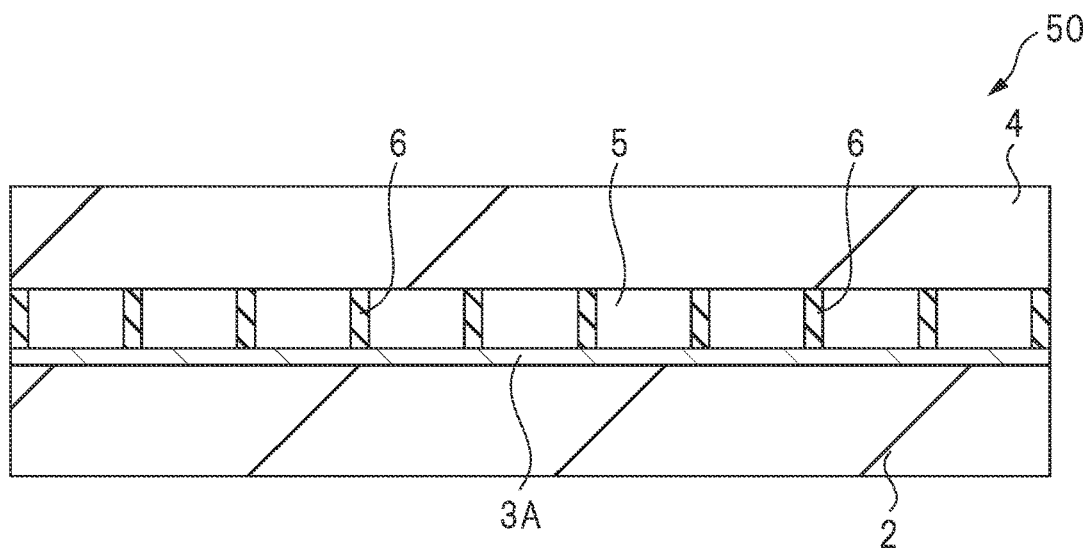

FIG. 21 is a cross-sectional view taken along a line A-A of FIG. 20. In FIG. 21, the amorphous silicon film 3A is formed on the substrate 2, and the plurality of protrusions 6 are formed on the amorphous silicon film 3A. And, the light-transmittable member 4 is arranged above the amorphous silicon film 3A so as to be supported by the plurality of protrusions 6. In this case, a plurality of gaps 5 are formed so as to be surrounded by the substrate 2 on which the amorphous silicon film 3A is formed, the light-transmittable member 4 and the plurality of protrusions 6, and this gap 5 is filled with inert gas as exemplified by nitrogen gas. Particularly when an electrostatically-charging process is performed to this inert gas, the light-transmittable member 4 and the substrate 2 on which the amorphous silicon film 3A is formed are fixed to the plurality of protrusions 6 by the inert gas to which the electrostatically-charging process has been performed. However, the present invention is not limited to this, and the light-transmittable member 4 and the substrate 2 on which the amorphous silicon film 3A is formed can be also fixed to the plurality of protrusions 6 by, for example, using a peelable adhesive.

In the manner as described above, the "substrate structural object 50" according to the present second embodiment is configured.

<Method for Manufacturing "Substrate Structural Object 50">

The "substrate structural object 50" according to the present second embodiment is configured as described above, and a method for manufacturing the same will be explained below with reference to the drawings.

Figure 22:
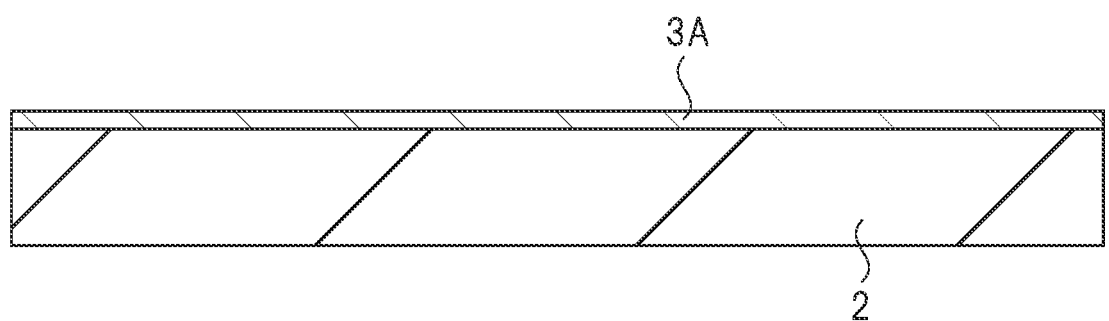
Figure 23:
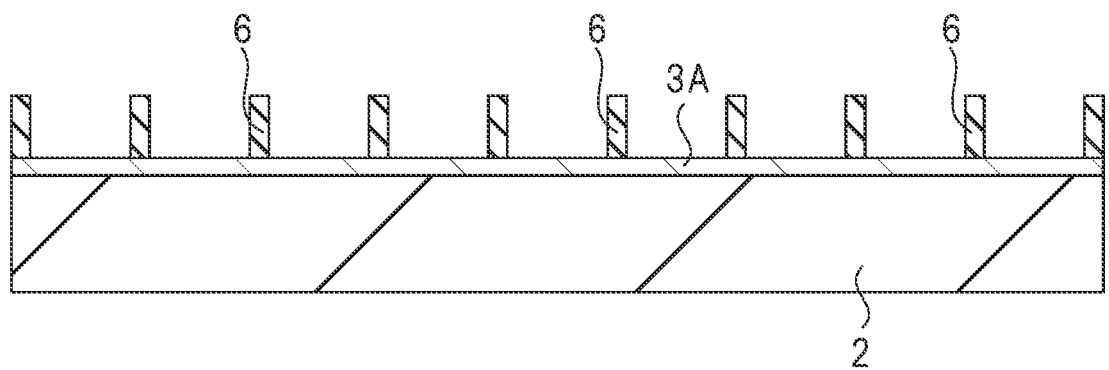
Figure 24:
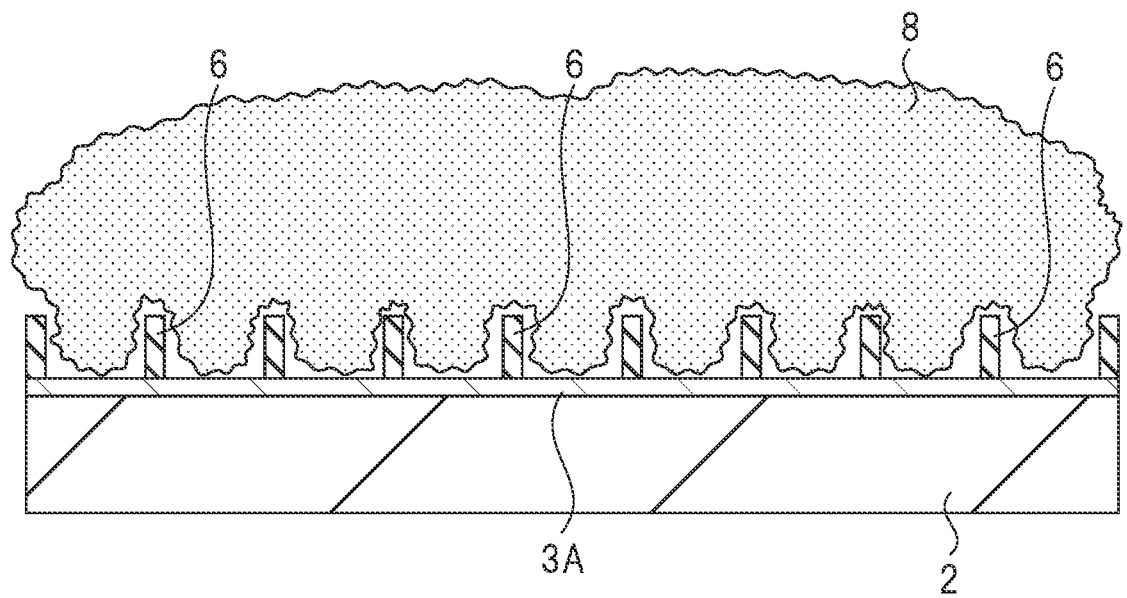
FIG. 24 is a cross-sectional view showing a method for manufacturing the "substrate structural object", continued from FIG. 23.
Figure 25:
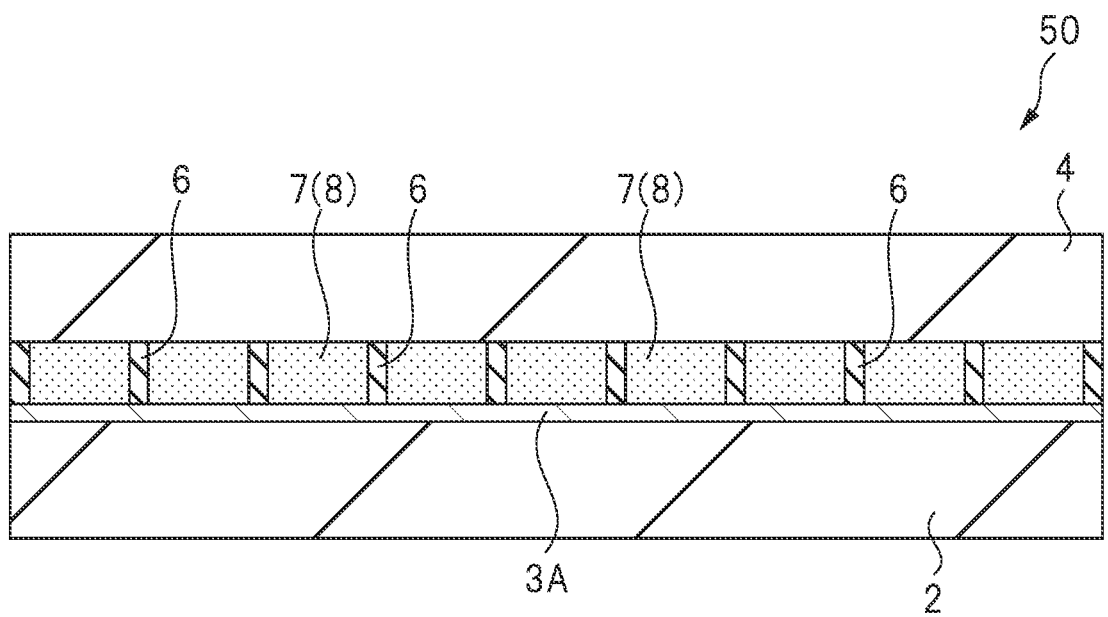
FIG. 25 is a cross-sectional view showing a method for manufacturing the "substrate structural object", continued from FIG. 24.

First, as shown in FIG. 22, the amorphous silicon film 3a that is the non-crystalline semiconductor film is formed on the substrate 2. Next, as shown in FIG. 23, the plurality of protrusions 6 are formed on the substrate 2 having the amorphous silicon film 3A that is the non-crystalline semiconductor film formed on its upper surface. More specifically, the plurality of protrusions 6 can be formed by applying a resist film onto the amorphous silicon film 3a, and then, performing exposure and development processes to this resist film. Subsequently, as shown in FIGS. 24 and 25, the light-transmittable member that can transmit the laser light is mounted through the plurality of protrusions 6 above the substrate 2 having the amorphous silicon film 3A formed thereon, under atmosphere of the inert gas 8 as exemplified by the nitrogen gas. At this time, when the electrostatically-charging process is performed to the inert gas, the light-transmittable member 4 is fixed to the plurality of protrusions 6 by the electrostatic force.

After the "substrate structural object 50" according to the present second embodiment is manufactured as described above, this "substrate structural object 50" is carried into, for example, the processing chamber 505 of the laser processing apparatus 1000 shown in FIG. 19. Then, as shown in FIG. 19, the laser light is emitted to the amorphous silicon film 3A through the gap 5 that is formed below the light-transmittable member 4, so that the amorphous silicon film is changed into the polysilicon film. At this time, the "substrate structural object 50" according to the present second embodiment has the gap 5 between the light-transmittable member 4 and the amorphous silicon film 3A as shown in FIG. 25, and therefore, the sufficient protrusions can be formed in the gap 5. Because of this, according to the present second embodiment, the evenness of the crystal grains configuring the polysilicon film can be improved.

First Modification Example

Subsequently, a first modification example of the second embodiment will be explained.

Figure 26:
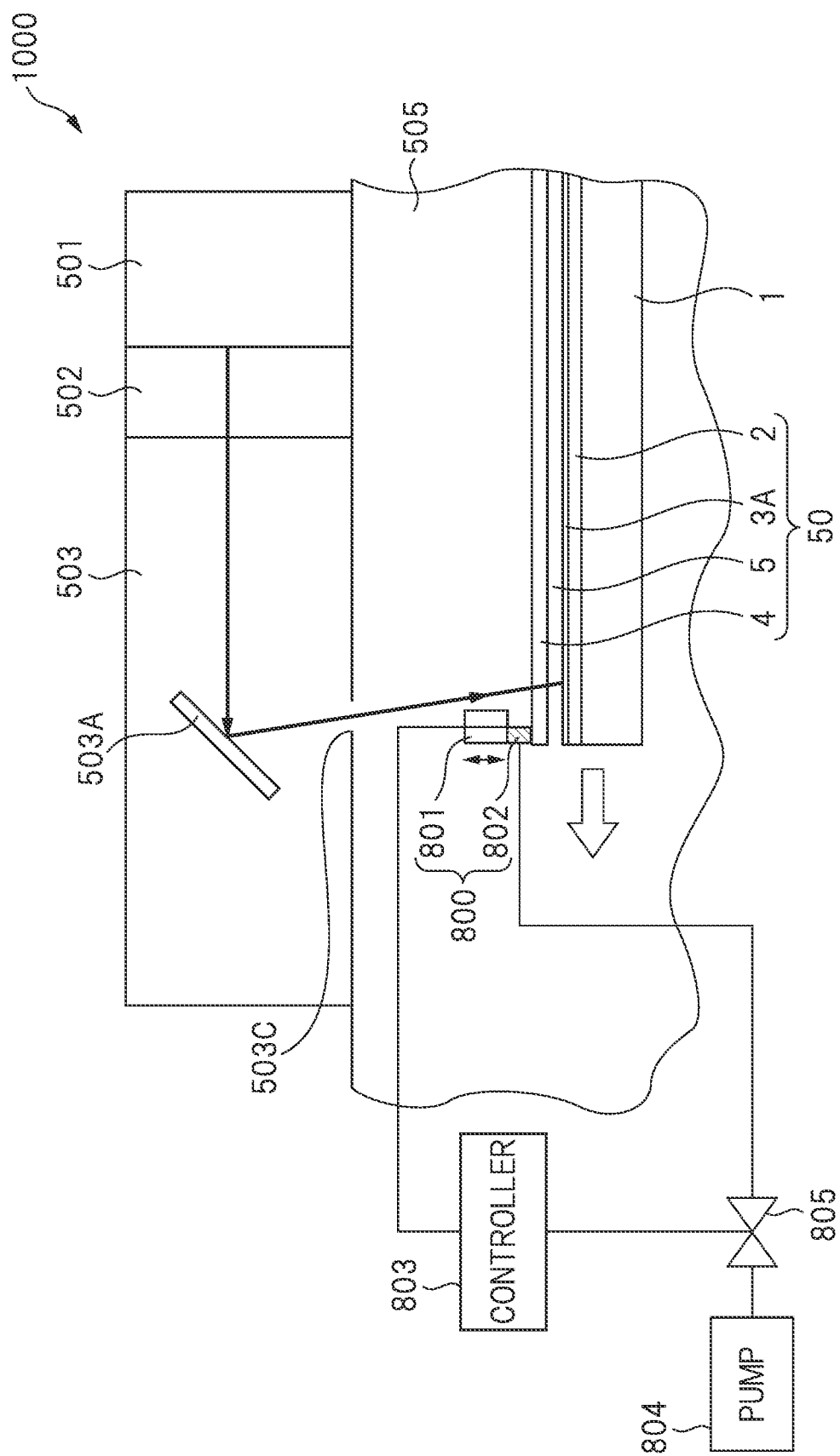
FIG. 26 is a diagram showing a configuration of a laser processing apparatus of a first modification example of the second embodiment.

FIG. 26 is a diagram showing a schematic configuration of a laser processing apparatus according the present first modification example.

A configuration of the laser processing apparatus 1000 according to the present first modification example (see FIG. 26) is almost the same as the configuration of the laser processing apparatus 1000 according to the second embodiment (see FIG. 19), and therefore, differences will be mainly explained.

The laser processing apparatus 1000 according to the present first modification example in FIG. 26 includes a suction portion 800 that is formed above the "substrate structural object 50". This suction portion 800 is made of a displacement mechanism 801 configured so that the suction portion 800 is displaceable in up and down directions and a suction mechanism 802 configured to suck the light-transmittable member 4 of the "substrate structural object 50".

This suction portion 800 is electrically connected to a controller 803 that controls the suction portion 800. The controller 803 is electrically connected to a valve 805 that is arranged between a pump 804 and the suction portion 800. The controller 803 is configured so that the displacement mechanism 801 of the suction portion 800 can be controlled, and is configured so that an opening level of the valve 805 can be controlled.

The laser processing apparatus 1000 according to the present first modification example is configured as described above, and an operation of the laser processing apparatus 1000 according to the present first modification example will be explained below with reference to the drawings. First, in FIG. 26, the controller 803 adjusts the opening level of the valve 805. This manner adjusts a suction pressure that is applied from the suction mechanism 802 of the suction portion 800 connected to the pump 804 through the valve 805, so that the light-transmittable member 4 of the "substrate structural object 50" is sucked by the suction portion 800. Next, the controller 803 controls the displacement mechanism 801 of the suction portion 800. This manner displaces, in the up and down directions, the suction portion 800 that sucks the light-transmittable member 4 of the "substrate structural object 50". As a result, the height of the gap 5 between the light-transmittable member 4 and the substrate 2 having the amorphous silicon film 3A formed thereon is adjusted. As described above, the height of the gap 5 between the light-transmittable member 4 and the substrate 2 having the amorphous silicon film 3A formed thereon is set to be a desirable value under the control of the controller 803 for the suction portion 800 and the valve 805.

Then, the laser light is generated in the laser light generator 501.

Next, in FIG. 26, a light output of the laser light that has been output from the laser light generator 501 is adjusted by the light attenuator 502, and then, the laser light is input to the optical system module 503. The laser light that has been input to the optical system module 503 is shaped to be a linear-beam shaped laser light by a lens system arranged inside the optical system module 503. The linear-beam shaped laser light is reflected by, for example, the reflection mirror 503A that is arranged inside the optical system module 503, and then, is input to the processing chamber 505 through the opening 503C. The laser light that has been input to the processing chamber 505 travels in the internal space of the processing chamber 505, and then, is emitted to the "substrate structural object 50" that is arranged on the carrying stage 1. More specifically, the laser light is emitted to the amorphous silicon film 3A that is formed on the surface of the substrate 2, through the gap 5 and the light-transmittable member 4 configuring a part of the "substrate structural object 50". In the manner, in the laser processing apparatus 1000 according to the present first modification example, the linear-beam shaped laser light is emitted to the amorphous silicon film 3A that is formed on the surface of the substrate 2, through the gap 5 and the light-transmittable member 4. More specifically, the linear-beam shaped laser light is emitted to the amorphous silicon film 3A that is formed on the surface of the substrate 2, through the gap 5 and the light-transmittable member 4 while the carrying stage 1 is moving in the arrow direction. As a result, the amorphous silicon film 3A that is formed on the surface of the substrate 2 is locally heated, so that the region to which the laser light is emitted in the amorphous silicon film 3A can be scanned while the region to which the laser light is emitted in the amorphous silicon film 3A is changed into the polysilicon film. In the manner, in the laser processing apparatus 1000 according to the present first modification example, the entire amorphous silicon film 3A can be changed into the polysilicon film. At this time, also in the present first modification example, the gap 5 exists between the light-transmittable member 4 and the amorphous silicon film 3A as shown in FIG. 26, and therefore, the sufficient protrusions can be formed in the gap 5. Because of this, also in the present first modification example, the evenness of the crystal grains configuring the polysilicon film can be improved.

Effectiveness of First Modification Example

As described above, according to the present first modification example, the height of the gap between the light-transmittable member 4 and the substrate 2 having the amorphous silicon film 3A formed thereon can be changed.

In this case, as explained in the section "<Findings on Laser Process>" in the second embodiment, the protrusions are formed on the surface when the amorphous silicon film 3A is changed into the polysilicon film 3B, and there is the correlation between the size of each protrusion and the size of each crystal grain configuring the polysilicon film 3B. For example, the larger the size of the grown protrusion is, the larger the size of the crystal grain configuring the polysilicon film 3B is. Therefore, for example, the fact that the height of the gap between the light-transmittable member 4 and the substrate 2 having the amorphous silicon film 3A formed thereon can be changed by the arrangement of the suction portion 800 in the present first modification example means that the size of the crystal grain configuring the polysilicon film 3B can be adjusted. For example, by the application of the configuration of the suction portion 800 of the present first modification example, the light-transmittable member 4 and the substrate 2 having the amorphous silicon film 3A formed thereon can be adhered to each other without the gap 5, and, conversely, the gap 5 can be enlarged.

Practically, in the case without the gap 5, the size of the crystal grain configuring the polysilicon film 3B can be set in about a range from several nm or more to several tens of nm or less. Conversely, for example, when the height of the gap 5 is larger than the thickness of the amorphous silicon film 3A and when the gap 5 is filled with the inert gas, the size of the crystal grain configuring the polysilicon film 3B can be made large up to several hundreds of nm.

Second Modification Example

Next, a second modification example of the second embodiment will be explained.

Figure 27:
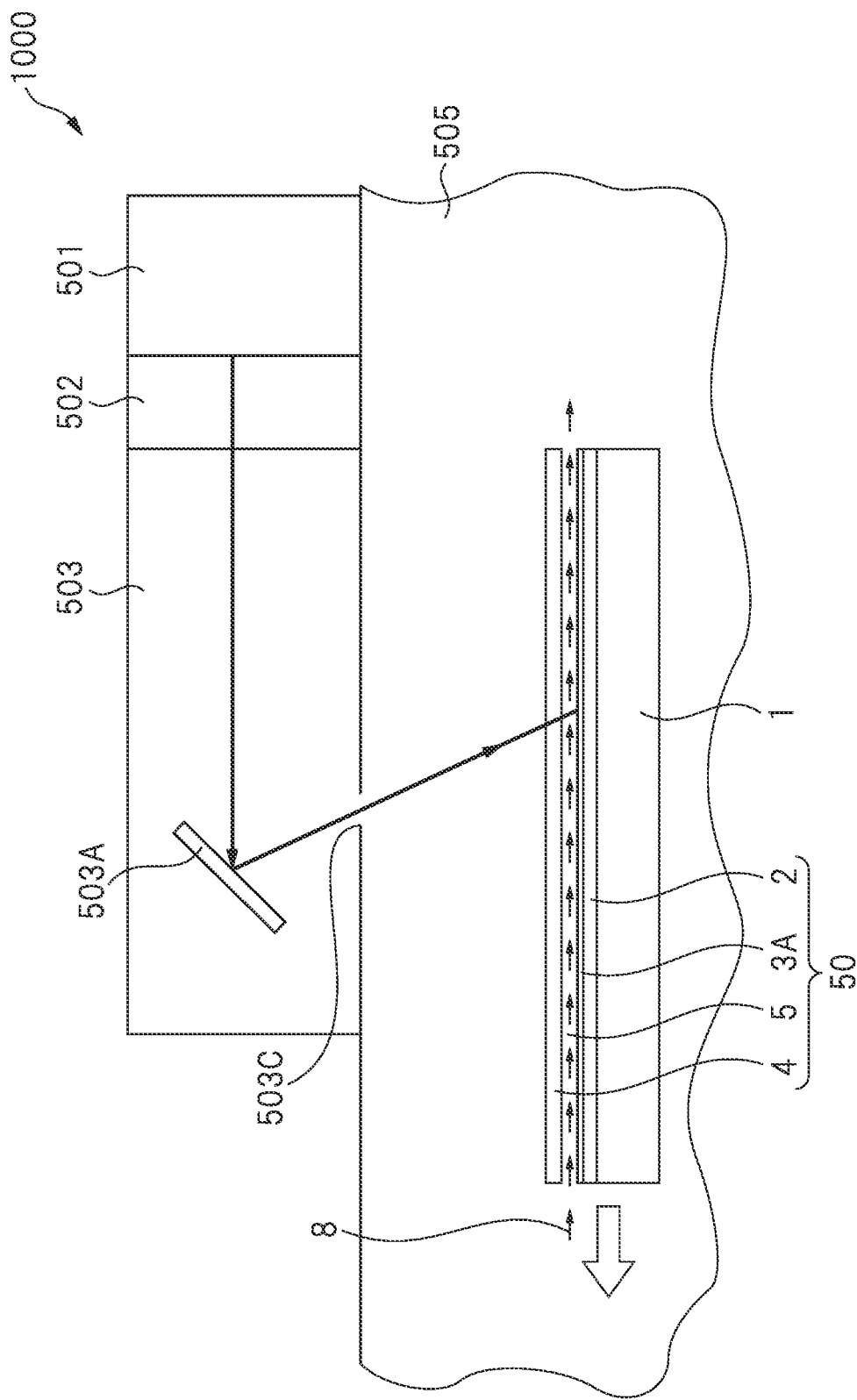
FIG. 27 is a diagram showing a configuration of a laser processing apparatus of a second modification example of the second embodiment.

FIG. 27 is a diagram showing a schematic configuration of a laser processing apparatus according to the present second modification example.

A configuration of the laser processing apparatus 1000 according to the present second modification example (see FIG. 27) is almost the same as the configuration of the laser processing apparatus 1000 according to the second embodiment (see FIG. 19), and therefore, differences will be mainly explained.

In FIG. 27, the "substrate structural object 50" arranged on the carrying stage 1 of the laser processing apparatus 1000 according to the present second modification example includes the gap 5 between the light-transmittable member 4 and the substrate 2 having the amorphous silicon film 3A formed thereon. In the present second modification example, the inert gas 8 as exemplified by nitrogen gas is flown in this gap 5. Even in the case with the gap 5, when the inert gas 8 having a certain flow rate is flown in the gap 5 as described above, the atmosphere inside the gap 5 over the amorphous silicon film 3A can be even, and therefore, the reduction in the characteristics of the polysilicon film due to the unevenness of the atmosphere over the amorphous silicon film 3A can be suppressed.

In the foregoing, the invention made by the present inventors has been concretely described on the basis of the embodiments. However, it is needless to say that the present invention is not limited to the foregoing embodiments, and various alterations can be made within the scope of the present invention.

EXPLANATION OF REFERENCE CHARACTERS

1 . . . carrying stage
2 . . . substrate
3A . . . amorphous silicon film
3B . . . polysilicon film
4 . . . light-transmittable member
5 . . . gap
50 . . . substrate structural object
70A . . . small protrusion
70B . . . protrusion
506 . . . measuring device
507 . . . controller 508 . . . reflection mirror
800 . . . suction portion
801 . . . displacement mechanism
802 . . . suction mechanism
803 . . . controller
804 . . . pump
805 . . . valve
1000 . . . laser processing apparatus

The invention claimed is:

1. A method for manufacturing a panel comprising the steps of:
   (a) mounting a member configured to be able to transmit laser light on a substrate having a non-crystalline semiconductor film foiled on its upper surface;
   (b) forming a polycrystalline semiconductor film by emission of the laser light to the non-crystalline semiconductor film through the member; and
   (c) after the step (b), removing the member from the substrate,
   wherein the member is composed of an untreated mother glass substrate of same size as the substrate, and
   wherein the member is not a component of the panel.

2. The method for manufacturing the panel according to claim 1,
   wherein the member is arranged so as to entirely cover the upper surface of the substrate.

3. The method for manufacturing the panel according to claim 1,
   wherein the member and the substrate are fixed to each other by static electricity.

4. The method for manufacturing the panel according to claim 1,
   wherein the substrate is arranged on a movable stage.

5. The method for manufacturing the panel according to claim 1,
   wherein the substrate is carried while being floated above a fixed stage.

6. The method for manufacturing the panel according to claim 1,
   wherein a gap is foamed between the substrate and the member, and
   the gap is filled with inert gas.

7. The method for manufacturing the panel according to claim 6,
   wherein the gap is larger than a thickness of the non-crystalline semiconductor film.

8. The method for manufacturing the panel according to claim 6,
   wherein the inert gas is nitrogen gas.

9. The method for manufacturing the panel according to claim 6,
   wherein an electrostatically-charging process is performed to the inert gas.

10. The method for manufacturing the panel according to claim 1,
    wherein the non-crystalline semiconductor film is an amorphous silicon film, and
    the polycrystalline semiconductor film is a polysilicon film.

11. The method for manufacturing the panel according to claim 1,
    wherein the step (b) is performed plural times.

12. The method for manufacturing the panel according to claim 1,
    wherein the panel includes a plurality of pixel regions,
    a thin film transistor is foamed in each of the plurality of pixel regions, and
    the polycrystalline semiconductor film is a channel film of the thin film transistor.

13. The method for manufacturing the panel according to claim 12,
    wherein the panel is a display panel for use in a television.

14. The method for manufacturing the panel according to claim 12,
    wherein the panel is a display panel for use in a mobile communication device.

15. A method for manufacturing a panel comprising the steps of:
    (a) forming a plurality of protrusions on a substrate having a non-crystalline semiconductor film foamed on its upper surface;
    (b) mounting a member configured to be able to transmit laser light above the substrate having the non-crystalline semiconductor film so that the member is supported by the plurality of protrusions under atmosphere of inert gas;
    (c) forming a polycrystalline semiconductor film by emission of the laser light to the non-crystalline semiconductor film through the member; and
    (d) after the step (c), removing the member from the substrate,
    wherein the member is composed of an untreated mother glass substrate of same size as the substrate, and
    wherein the member is not a component of the panel.

16. A laser processing apparatus for manufacturing a panel, comprising:
    a laser oscillator configured to emit laser light;
    a carrying stage configured to carry a substrate to which the laser light is emitted;
    a measuring device arranged above the carrying stage; and
    a controller configured to be able to control energy of the laser light on the basis of a value that is output from the measuring device,
    wherein a member configured to be able to transmit the laser light is mounted on an upper surface of the substrate, and
    the measuring device measures energy of reflection light generated when the laser light is reflected by the member,
    wherein the member is composed of an untreated mother glass substrate of same size as the substrate, and
    wherein the member is not a component of the panel.

17. A laser processing apparatus for manufacturing a panel, comprising:
    a laser oscillator configured to emit laser light;
    a carrying stage configured to carry a substrate to which the laser light is emitted; and
    a reflection mirror arranged above the carrying stage,
    wherein a member configured to be able to transmit the laser light is mounted on an upper surface of the substrate,
    the reflection mirror reflects the laser light that is reflected by the member, to the substrate, and
    the substrate is able to be preheated by the laser light that is reflected by the reflection mirror,
    wherein the member is composed of an untreated mother glass substrate of same size as the substrate, and
    wherein the member is not a component of the panel.

18. The laser processing apparatus according to claim 16,
    wherein a non-crystalline semiconductor film is formed on an upper surface of the substrate, and the non-crystalline semiconductor film is modified into a polycrystalline semiconductor film by emission of the laser light.

19. The laser processing apparatus according to claim 16, wherein the member is arranged so as to entirely cover the upper surface of the substrate.

20. The laser processing apparatus according to claim 16, wherein the member and the substrate are fixed to each other by static electricity.

21. The laser processing apparatus according to claim 16, wherein a gap is formed between the substrate and the member, and
the gap is filled with inert gas.

22. The laser processing apparatus according to claim 16, wherein the carrying stage is movable, and
the substrate is fixed onto the carrying stage.

23. The laser processing apparatus according to claim 16, wherein the carrying stage is able to carry the substrate while floating the substrate.

24. A laser processing apparatus for manufacturing a panel, comprising:
a laser oscillator configured to emit laser light;
a carrying stage configured to carry a substrate to which the laser light is emitted; and
a suction portion arranged above the substrate and configured to be displaceable in up and down directions,
wherein a member configured to be able to transmit the laser light is mounted on a portion between the substrate and the suction portion, and
the suction portion is able to suck the member,
wherein the member is composed of an untreated mother glass substrate of same size as the substrate, and
wherein the member is not a component of the panel.

25. The laser processing apparatus according to claim 17, wherein a non-crystalline semiconductor film is formed on an upper surface of the substrate, and
the non-crystalline semiconductor film is modified into a polycrystalline semiconductor film by emission of the laser light.

26. The laser processing apparatus according to claim 17, wherein the member is arranged so as to entirely cover the upper surface of the substrate.

27. The laser processing apparatus according to claim 17, wherein the member and the substrate are fixed to each other by static electricity.

28. The laser processing apparatus according to claim 17, wherein a gap is formed between the substrate and the member, and
the gap is filled with inert gas.

29. The laser processing apparatus according to claim 17, wherein the carrying stage is movable, and
the substrate is fixed onto the carrying stage.

30. The laser processing apparatus according to claim 17, wherein the carrying stage is able to carry the substrate while floating the substrate.

* * * * *